US008812051B2

(12) United States Patent
Jouin

(10) Patent No.: US 8,812,051 B2
(45) Date of Patent: Aug. 19, 2014

(54) GRAPHICAL USER INTERFACES CUES FOR OPTIMAL DATAPATH SELECTION

(75) Inventor: Christophe Max Jean Jouin, Oakville (CA)

(73) Assignee: Z124, George Town (KY)

( * ) Notice: Subject to any disclaimer, the term of this patent is extended or adjusted under 35 U.S.C. 154(b) by 0 days.

(21) Appl. No.: 13/571,951

(22) Filed: Aug. 10, 2012

(65) Prior Publication Data

US 2013/0079054 A1 Mar. 28, 2013

Related U.S. Application Data

(60) Provisional application No. 61/539,884, filed on Sep. 27, 2011.

(51) Int. Cl.
*H04M 1/00* (2006.01)
*H04W 72/06* (2009.01)
*H04W 88/06* (2009.01)
*H04W 48/18* (2009.01)

(52) U.S. Cl.
CPC .............. *H04W 72/06* (2013.01); *H04W 88/06* (2013.01); *H04W 48/18* (2013.01)
USPC .................... 455/550.1; 455/435.1; 455/452.2

(58) Field of Classification Search
CPC ...... H04W 48/18; H04W 72/06; H04W 88/06
USPC .............. 455/403, 414.1, 432.3, 433, 435.1, 455/435.2, 552.1, 553.1, 556.1, 556.2, 557, 455/558, 561, 562.1, 550.1, 566
See application file for complete search history.

(56) References Cited

U.S. PATENT DOCUMENTS

| 3,675,209 | A | 7/1972 | Trost |
| 4,839,453 | A | 6/1989 | Chung et al. |
| 5,488,702 | A | 1/1996 | Byers et al. |
| 5,553,083 | A | 9/1996 | Miller |
| 5,555,391 | A | 9/1996 | De Subijana et al. |
| 5,572,678 | A | 11/1996 | Homma et al. |
| 5,903,724 | A | 5/1999 | Takamoto et al. |
| 5,951,706 | A | 9/1999 | Benner |
| 6,308,178 | B1 | 10/2001 | Chang et al. |
| 7,031,264 | B2 | 4/2006 | Adhikari et al. |
| 7,047,297 | B2 | 5/2006 | Huntington et al. |
| 7,117,308 | B1 | 10/2006 | Mitten et al. |
| 7,124,152 | B2 | 10/2006 | Fish |

(Continued)

FOREIGN PATENT DOCUMENTS

| KR | 10-0547749 | 1/2006 |
| KR | 10-2006-0028961 | 4/2006 |
| KR | 10-0748900 | 8/2007 |

OTHER PUBLICATIONS

U.S. Appl. No. 13/188,335, filed Jul. 21, 2011, Pocklington.

(Continued)

*Primary Examiner* — Jean Gelin
(74) *Attorney, Agent, or Firm* — Sheridan Ross P.C.

(57) ABSTRACT

A wireless communication device is provided that includes modules to access a cellular network, a non-cellular network, a plurality of communication networks. A mobile network selector can access network information comprising one or more of network speed, network reliability, network performance, network bandwidth, network throughput, and data transmission cost and receive, and select a compatible and currently accessible communication based on the network information.

21 Claims, 13 Drawing Sheets

(56) References Cited

U.S. PATENT DOCUMENTS

| | | |
|---|---|---|
| 7,178,060 B2 | 2/2007 | Bamford |
| 7,272,613 B2 | 9/2007 | Sim et al. |
| 7,484,000 B2 | 1/2009 | Jiang |
| 7,551,608 B1 | 6/2009 | Roy |
| 7,623,466 B2 | 11/2009 | Whitehead |
| 7,627,343 B2 | 12/2009 | Fadell |
| 7,675,939 B2 | 3/2010 | Kawamura et al. |
| 7,688,867 B1 | 3/2010 | Kizhepat |
| 7,719,830 B2 | 5/2010 | Howarth |
| 7,885,264 B2 | 2/2011 | Tateno et al. |
| 7,899,451 B2 | 3/2011 | Hu et al. |
| 8,010,646 B2 | 8/2011 | Bier et al. |
| 8,027,293 B2 | 9/2011 | Spaur et al. |
| 8,131,556 B2 | 3/2012 | Barton et al. |
| 8,161,175 B2 | 4/2012 | Lu |
| 8,184,552 B2 * | 5/2012 | Onda et al. .................... 370/252 |
| 8,373,538 B1 * | 2/2013 | Hildner et al. ................. 340/3.1 |
| 8,385,200 B2 * | 2/2013 | Rainer et al. .................. 370/232 |
| 8,391,928 B2 * | 3/2013 | Karaoguz et al. ............. 455/566 |
| 8,532,124 B2 | 9/2013 | Satterlee et al. |
| 2001/0037406 A1 | 11/2001 | Philbrick et al. |
| 2002/0002550 A1 | 1/2002 | Berman |
| 2002/0110134 A1 | 8/2002 | Gracon et al. |
| 2003/0063324 A1 | 4/2003 | Takaoka |
| 2003/0097481 A1 | 5/2003 | Richter |
| 2004/0121778 A1 | 6/2004 | Hunkeler et al. |
| 2004/0221004 A1 | 11/2004 | Chalfin et al. |
| 2007/0083574 A1 | 4/2007 | Garin, Jr. et al. |
| 2007/0223483 A1 | 9/2007 | Huang et al. |
| 2007/0233994 A1 | 10/2007 | Ye |
| 2007/0300120 A1 | 12/2007 | Kim et al. |
| 2008/0162514 A1 | 7/2008 | Franks et al. |
| 2008/0201751 A1 | 8/2008 | Ahmed et al. |
| 2009/0031092 A1 | 1/2009 | Tsumura |
| 2009/0303999 A1 | 12/2009 | Guguen et al. |
| 2010/0041434 A1 | 2/2010 | Hirano |
| 2010/0235701 A1 | 9/2010 | Choo |
| 2010/0262711 A1 | 10/2010 | Bouazizi |
| 2010/0304730 A1 | 12/2010 | Huang et al. |
| 2011/0078249 A1 | 3/2011 | Blocksome et al. |
| 2011/0093437 A1 | 4/2011 | Sampathkumar |
| 2011/0096828 A1 | 4/2011 | Chen et al. |
| 2011/0103377 A1 | 5/2011 | Hua et al. |
| 2012/0079001 A1 | 3/2012 | Chincisan |
| 2012/0079076 A1 | 3/2012 | Chincisan |
| 2012/0079323 A1 | 3/2012 | Chincisan |
| 2012/0081267 A1 | 4/2012 | Sirpal et al. |
| 2012/0081268 A1 | 4/2012 | Sirpal et al. |
| 2012/0081269 A1 | 4/2012 | de Paz |
| 2012/0081270 A1 | 4/2012 | Gimpl et al. |
| 2012/0081271 A1 | 4/2012 | Gimpl et al. |
| 2012/0081280 A1 | 4/2012 | Schrock et al. |
| 2012/0081289 A1 | 4/2012 | Sirpal et al. |
| 2012/0081292 A1 | 4/2012 | Sirpal et al. |
| 2012/0081293 A1 | 4/2012 | Sirpal et al. |
| 2012/0081302 A1 | 4/2012 | Gimpl et al. |
| 2012/0081303 A1 | 4/2012 | Cassar et al. |
| 2012/0081304 A1 | 4/2012 | Sirpal et al. |
| 2012/0081305 A1 | 4/2012 | Schrock |
| 2012/0081306 A1 | 4/2012 | Sirpal et al. |
| 2012/0081307 A1 | 4/2012 | Sirpal et al. |
| 2012/0081308 A1 | 4/2012 | Sirpal |
| 2012/0081309 A1 | 4/2012 | Sirpal et al. |
| 2012/0081310 A1 | 4/2012 | Schrock |
| 2012/0081311 A1 | 4/2012 | Sirpal et al. |
| 2012/0081312 A1 | 4/2012 | Sirpal et al. |
| 2012/0081313 A1 | 4/2012 | Sirpal et al. |
| 2012/0081314 A1 | 4/2012 | Sirpal et al. |
| 2012/0081315 A1 | 4/2012 | Sirpal |
| 2012/0081316 A1 | 4/2012 | Sirpal et al. |
| 2012/0081317 A1 | 4/2012 | Sirpal et al. |
| 2012/0081318 A1 | 4/2012 | Sirpal et al. |
| 2012/0081319 A1 | 4/2012 | Gimpl et al. |
| 2012/0081322 A1 | 4/2012 | Sirpal et al. |
| 2012/0081323 A1 | 4/2012 | Sirpal et al. |
| 2012/0081397 A1 | 4/2012 | de Paz |
| 2012/0081398 A1 | 4/2012 | Sirpal et al. |
| 2012/0081399 A1 | 4/2012 | Sirpal et al. |
| 2012/0081400 A1 | 4/2012 | Schrock |
| 2012/0081401 A1 | 4/2012 | Sirpal et al. |
| 2012/0081403 A1 | 4/2012 | Sirpal et al. |
| 2012/0081854 A1 | 4/2012 | Sirpal et al. |
| 2012/0083319 A1 | 4/2012 | Sirpal et al. |
| 2012/0084673 A1 | 4/2012 | Sirpal et al. |
| 2012/0084674 A1 | 4/2012 | Visosky |
| 2012/0084675 A1 | 4/2012 | Sirpal et al. |
| 2012/0084676 A1 | 4/2012 | de Paz |
| 2012/0084677 A1 | 4/2012 | Sirpal et al. |
| 2012/0084678 A1 | 4/2012 | Sirpal et al. |
| 2012/0084679 A1 | 4/2012 | Sirpal et al. |
| 2012/0084680 A1 | 4/2012 | Gimpl et al. |
| 2012/0084681 A1 | 4/2012 | Cassar |
| 2012/0084682 A1 | 4/2012 | Sirpal et al. |
| 2012/0084686 A1 | 4/2012 | Sirpal et al. |
| 2012/0084687 A1 | 4/2012 | Sirpal et al. |
| 2012/0084693 A1 | 4/2012 | Sirpal et al. |
| 2012/0084694 A1 | 4/2012 | Sirpal et al. |
| 2012/0084698 A1 | 4/2012 | Sirpal et al. |
| 2012/0084699 A1 | 4/2012 | Sirpal et al. |
| 2012/0084700 A1 | 4/2012 | Sirpal et al. |
| 2012/0084701 A1 | 4/2012 | Sirpal et al. |
| 2012/0084706 A1 | 4/2012 | Sirpal et al. |
| 2012/0084709 A1 | 4/2012 | Sirpal |
| 2012/0084710 A1 | 4/2012 | Sirpal et al. |
| 2012/0084712 A1 | 4/2012 | Gimpl et al. |
| 2012/0084714 A1 | 4/2012 | Sirpal et al. |
| 2012/0084715 A1 | 4/2012 | Sirpal et al. |
| 2012/0084716 A1 | 4/2012 | Sirpal et al. |
| 2012/0084718 A1 | 4/2012 | Gimpl et al. |
| 2012/0084719 A1 | 4/2012 | Sirpal et al. |
| 2012/0084720 A1 | 4/2012 | Sirpal et al. |
| 2012/0084721 A1 | 4/2012 | Gimpl et al. |
| 2012/0084722 A1 | 4/2012 | Cassar et al. |
| 2012/0084723 A1 | 4/2012 | Reeves et al. |
| 2012/0084724 A1 | 4/2012 | Sirpal et al. |
| 2012/0084725 A1 | 4/2012 | Sirpal et al. |
| 2012/0084726 A1 | 4/2012 | Sirpal et al. |
| 2012/0084727 A1 | 4/2012 | Sirpal et al. |
| 2012/0084739 A1 | 4/2012 | Sirpal et al. |
| 2012/0105363 A1 | 5/2012 | Sirpal et al. |
| 2012/0110486 A1 | 5/2012 | Sirpal et al. |
| 2012/0110497 A1 | 5/2012 | Gimpl et al. |
| 2012/0117495 A1 | 5/2012 | Sirpal et al. |
| 2012/0124490 A1 | 5/2012 | Sirpal et al. |
| 2012/0135704 A1 | 5/2012 | Gunasekara |
| 2012/0144323 A1 | 6/2012 | Sirpal et al. |
| 2012/0174028 A1 | 7/2012 | Sirpal et al. |
| 2013/0086293 A1 | 4/2013 | Bosse |
| 2013/0210489 A1 | 8/2013 | Jouin |
| 2013/0210494 A1 | 8/2013 | Jouin |

OTHER PUBLICATIONS

U.S. Appl. No. 13/571,668, filed Aug. 10, 2012, Jouin.
U.S. Appl. No. 13/571,724, filed Aug. 10, 2012, Jouin.
U.S. Appl. No. 13/571,829, filed Aug. 10, 2012, Jouin.
U.S. Appl. No. 13/572,133, filed Aug. 10, 2012, Jouin.
U.S. Appl. No. 13/187,026, filed Jul. 20, 2011, Chen.
"1G", Wikipedia, Printed at http://en.wikipedia.org/wiki/1G on Jun. 6, 2012, 2 pages.
"2G", Wikipedia, Printed at http://en.wikipedia.org/wiki/2G on Jun. 6, 2012, 4 pages.
"3G," Wikipedia, printed Jun. 6, 2012, 8 pages (found at http://en.wikipedia.org/wiki/3G).
"4G," Wikipedia, printed Jun. 6, 2012, 10 pages (found at http://en.wikipedia.org/wiki/4G).
"5G", Wikipedia, Printed at http://en.wikipedia.org/wiki/5G on Jun. 6, 2012, 3 pages.
"Bluetooth," Wikipedia, printed Jun. 8, 2012, 11 pages (found at http://en.wikipedia.org/wiki/Bluetooth).
"Everything You Need to Know About 4G Wireless Technology", Techspot Guides, printed at http://www.techspot.com/guides/272-everything-about-4g/, printed on Jun. 8, 2012, 4 pages.

(56) References Cited

OTHER PUBLICATIONS

"Global Positioning System," Wikipedia, last modified Jan. 14, 2013, 15 pages (found at http://en.wikipedia.org/wiki/Global_Positioning_System).
"Lapdock™ for Motorola ATRIX," at http://www.motorola.com/Consumers/US-EN/Consumer-Product-and-Services/Mobile . . . , accessed Apr. 18, 2011, 1 page.
"Location-based service," Wikipedia, last modified, Jan. 7, 2013, 10 pages (found at http://en.wikipedia.org/wiki/Location-based_service).
"LTE Advanced," Wikipedia, last modified Dec. 24, 2012, 5 pages (found at http://en.wikipedia.org/wiki/LTE_Advanced).
"LTE (telecommunication)," Wikipedia, printed Jan. 15, 2013, 10 pages (found at http://en.wikipedia.org/wiki/3GPP_Long_Term_Evolution).
"Microsoft Outlook 2010 Product Guide," Microsoft, 2010, 65 pages.
"Moore's law," Wikipedia, printed Jan. 15, 2013, 11 pages (found at http://en.wikipedia.org/wiki/Moore's_law).
"Motorola ATRIX 4G Laptop Dock Review," at http://www.phonearena.com/reviews/Motorola-ATRIX-4G-Laptop-Dock-Review_id2667, Mar. 2, 2011, 6 pages.
"Pandora Radio," Wikipedia, printed Jan. 15, 2013, 7 pages (retrieved from http://en.wikipedia.org/wiki/Pandora_Radio).
"Reliability (computer networking)," Wikipedia, last modified Oct. 24, 2012, 2 pages (retrieved from http://en.wikipedia.org/wiki/Reliability_(computer_networking).
"Roaming Guard," CMI Technologies, Installation and User Manual Version 1.04, 2011, 8 pages.
"RootMetrics. The one true picture of carrier performance." RootMetrics, captured Dec. 22, 2011, 2 pages (retrieved from http://web.archive.org/web/20111222231550/http://www.rootmetrics.com/).
"Transmission Control Protocol," Wikipedia, last modified Jan. 14, 2013, 18 pages (retrieved from http://en.wikipedia.org/wiki/Transmission_Control_Protocol.
"User Datagram Protocol," Wikipedia, last modified Jan. 9, 2013, 6 pages (retrieved from http://en.wikipedia.org/wiki/User_Datagram_Protocol).
"Wi-Fi," Wikipedia, printed Jun. 6, 2012, 7 pages (http://en.wikipedia.org/wiki/Wi-Fi).
"Wireless HDMI," Wikipedia, last modified Sep. 24, 2012, 1 page (found at http://en.wikipedia.org/wiki/Wireless_HDMI).
"Wireless Standard: 4G," printed at http://www.nd.edu/-mhaenggi/NET/wireless/4G/, on Jun. 8, 2012, 6 pages.
Burns, C., "Motorola ATRIX 4G Laptop Dock Review," at http://androidcommunity.com/motorola-atrix-4g-laptop-dock-review-20110220/, Feb. 20, 2011, 5 pages.
Catacchio, Chad, "This smartphone has two huge screens . . . that rotate," The Next Web at http://thenextweb.com/asia/2010/10/07/this-smartphone-has-two-huge-screens-that-rotate/, Jul. 21, 2011, 2 pages.
Google images, accessed Apr. 18, 2011, 6 pages.
Google Search "wifi protocol stack", Printed at http://www.google.com/search?q=wifi=protocol+stack&hl=en&qscrl=1&nord=1&rlz=1T4 . . . on Jun. 8, 2012, 15 pages.
Harman03, "Kyocera Echo Dual-screen Android Phone," posted 4 weeks from Apr. 18, 2011, 3 pages.
Mitchell, "Wireless Standards—802.11b 802.11a 802.11g and 802.11n" About.com Guide, Printed at http://compnetworking.about.com/cs/wireless80211/a/aa80211standard.htm on Jun. 8, 2012, 2 pages.
Mok et al. "Location determination using WiFi fingerprinting versus WiFi trilateration," Journal of Location Based Services, Jun. 2007, pp. 145-159 (Abstract Only) (retrieved from http://dl.acm.org/citation.cfm?id=1451884).
Oraskari, "Bluetooth versus WLAN IEEE 802.11x" Product Modelling and Realization Group (PM&RG) Department of Computer Science and Engineering Helsinki University of Technology, jyrki.oraskari@hut.fi 37266J, 5 pages.

Ravi et al., "4G Mobile Broadband—LTE Network Architecture and Protocol Stack", International Journal of Research and Reviews in Ad Hoc Networks, vol. 1, No. 1, Mar. 2011, 8 pages.
Stein, S., "How does the Motorola Atrix 4G Lapdock compare with a laptop?" Crave—CNET, at http://news.cnet.com/8301-17938_105-20031251-1.html, Feb. 9, 2011, 7 pages.
Vilches, "Everything You Need to Know About 4G Wireless Technology", printed from www.techspot.com/guides/272-everything-about-4g/, Apr. 29, 2010, 12 pages.
Wikipedia, "Bandwidth (computing)", Printed at http://en.wikipedia.org/wiki/Network_bandwidth, on Jun. 6, 2012, 2 pages.
Wikipedia, "Bandwidth optimization", Printed at http://en.wikipedia.org/wiki/Bandwidth_optimization, on Jun. 6, 2012, 2 pages.
Wikipedia, "Bit rate", Printed at http://en.wikipedia.org/wiki/Bit_rate on Jun. 6, 2012, 8 pages.
Wikipedia, "IEEE 802.11", Printed at http://en.wikipedia.org/wiki/IEEE_802.11 on Jun. 8, 2012, 12 pages.
Wikipedia, "Measuring network throughput", Printed at http://en.wikipedia.org/wiki/Bandwidth_test on Jun. 6, 2012, 7 pages.
Wikipedia, "Network performance", Printed at http://en.wikipedia.org/wiki/Comparison_of_latency_and_throughput on Jun. 6, 2012, 7 pages.
Wikipedia "Protocol stack", Printed at http://en.wikipedia.org/wiki/Protocol_stack on Jun. 8, 2012, 4 pages.
Wikipedia, "Quality of service", Printed at http://en.wikipedia.org/wiki/Quality_of_service on Jun. 6, 2012, 11 pages.
Wikipedia, "Throughput", Printed at http://en.wikipedia.org/wiki/Throughput on Jun. 6, 2012, 7 pages.
Wikipedia "WiMAX", Printed at http://en.wikipedia.org/wiki/WiMAX on Jun. 6, 2012, 8 pages.
International Search Report for International (PCT) Patent Application No. PCT/US2011/052563, mailed Feb. 10, 2012 3 pages.
International Search Report for International (PCT) Patent Application No. PCT/US2011/052563, mailed Feb. 12, 2012 3 pages.
International Search Report for International (PCT) Patent Application No. PCT/US2011/052556, mailed Apr. 26, 2012 3 pages.
Wikipedia, "1G", Printed at http://en.wikipedia.org/wiki/1G on Jun. 6, 2012, 2 pages.
Wikipedia, "2G", Printed at http://en.wikipedia.org/wiki/2G on Jun. 6, 2012, 4 pages.
Wikipedia, "3G", Printed at http://en.wikipedia.org/wiki/3G on Jun. 6, 2012, 8 pages.
Wikipedia, "4G", Printed at http://en.wikipedia.org/wiki/4G on Jun. 6, 2012, 10 pages.
Techspot Guides, "Everything You Need to Know About 4G Wireless Technology", printed at http://www.techspot.com/guides/272-everything-about-4g/, printed on Jun. 8, 2012, 4 pages.
Introduction to Wireless Standard—4G, printed at http://www.nd.edu/-mhaenggi/NET/wireless/4G/, on Jun. 8, 2012, 6 pages.
Wikipedia, "5G", Printed at http://en.wikipedia.org/wiki/5G on Jun. 6, 2012, 3 pages.
Wikipedia, "Network performance", Printed at http://en.wikipedia.org/wiki/Comparison_of_latency_and_throughput on Jun. 6, 2012, 7 pages.
Wikipedia, "Bluetooth", Printed at http://en.wikipedia.org/wiki/Bluetooth on Jun. 8, 2012, 11 pages.
Wikipedia "Wi-Fi", Printed at http://en.wikipedia.org/wiki/WiFi on Jun. 6, 2012, 7 pages.
International Search Report for International (PCT) Patent Application No. PCT/US2011/052355, mailed Apr. 19, 2012 3 pages.
International Preliminary Report on Patentability for International (PCT) Patent Application No. PCT/US2011/052355, mailed Apr. 11, 2013 7 pages.
International Preliminary Report on Patentability for International (PCT) Patent Application No. PCT/US2011/052563, mailed Apr. 11, 2013 6 pages.
International Preliminary Report on Patentability for International (PCT) Patent Application No. PCT/US2011/052556, mailed Apr. 11, 2013 6 pages.
Official Action for U.S. Appl. No. 12/891,290, mailed May 15, 2013 15 pages.

(56) References Cited

OTHER PUBLICATIONS

Official Action for U.S. Appl. No. 13/186,307, mailed Nov. 7, 2012 8 pages.
Official Action for U.S. Appl. No. 12/891,438, mailed Sep. 24, 2012 16 pages.
Official Action for U.S. Appl. No. 12/891,438, mailed Mar. 1, 2013 19 pages.
Notice of Allowance for U.S. Appl. No. 13/188,335, mailed Apr. 3, 2013 14 pages.
Official Action for U.S. Appl. No. 13/572,133 mailed Nov. 19, 2013, 19 pages.
Official Action for U.S. Appl. No. 12/891,290, mailed Oct. 15, 2013, 7 pages.
Official Action for U.S. Appl. No. 13/186,307, mailed May 23, 2013 10 pages.
Notice of Allowance for U.S. Appl. No. 13/186,307, mailed Oct. 9, 2013 8 pages.
Official Action for U.S. Appl. No. 12/891,438, mailed Sep. 18, 2013 18 pages.
Official Action for U.S. Appl. No. 13/571,829, notification date Jan. 22, 2014, 19 pages.
Notice of Allowance for U.S. Appl. No. 12/891,290, mailed Feb. 3, 2014, 8 pages.
Notice of Allowance for U.S. Appl. No. 13/186,307, mailed Jan. 2, 2014 6 pages.
Notice of Allowance for U.S. Appl. No. 12/891,438, mailed Mar. 13, 2014 12 pages.
Notice of Allowance for U.S. Appl. No. 13/571,829, notification date May 1, 2014, 11 pages.

* cited by examiner

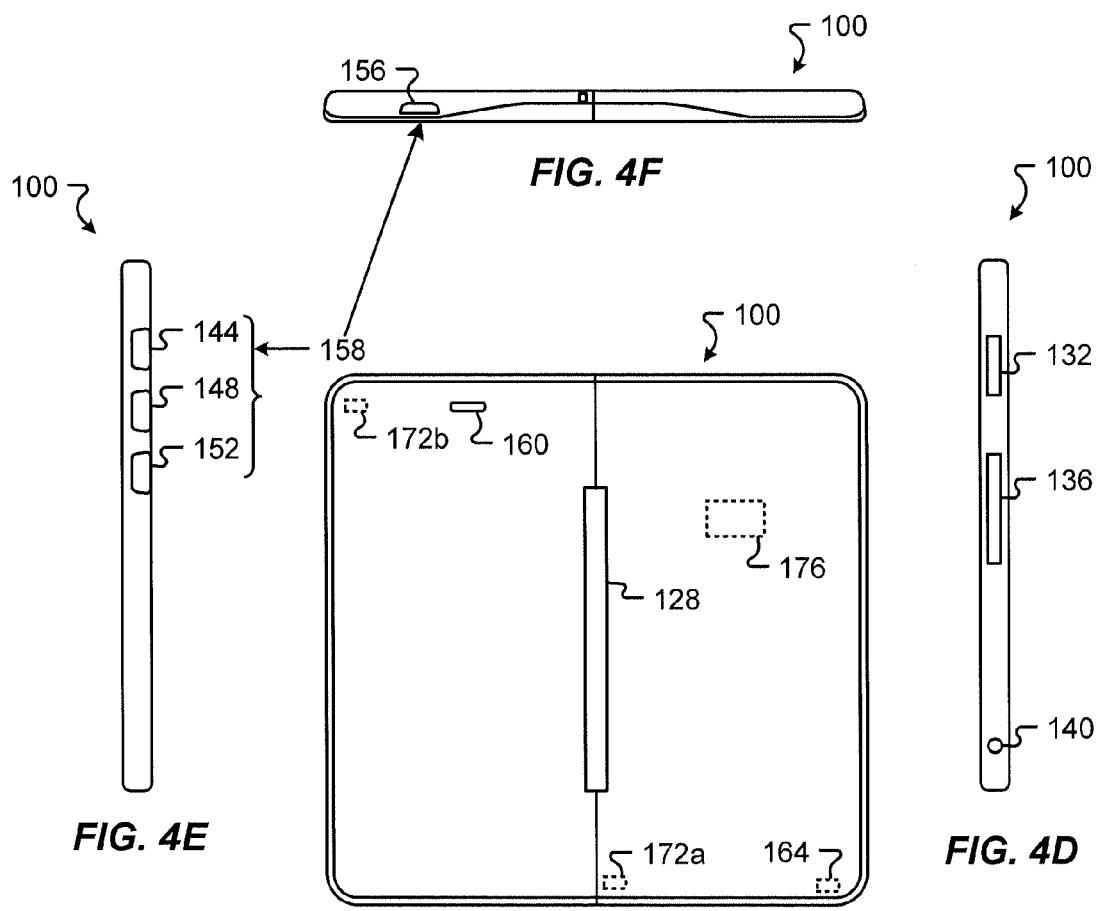

|  | PORTRAIT | | | | | | LANDSCAPE | | | | | |
|---|---|---|---|---|---|---|---|---|---|---|---|---|
|  | OPEN | CLOSED | EASEL | MODIFIED EASEL | PHONE | IMAGE/VIDEO | OPEN | CLOSED | EASEL | MODIFIED EASEL | PHONE | IMAGE/VIDEO |
| P OPEN | X | HT | HT | HT | P | I | AT | HAT | HAT | HAT | P | I |
| O CLOSED | HT | X | HAT | HAT | P | I | HAT | AT | HAT | HAT | P | I |
| R EASEL | HT | HT | X | X | P | I | HAT | HAT | HAT | HAT | P | I |
| T PHONE | HT | X | HT | HT | X | I | HAT | HAT | HAT | HAT | X | I |
| R IMAGE/VIDEO | HT | HT | HT | X | P | X | HAT | HAT | HAT | HAT | X | HAT |
| A | | | | | | | | | | | | |
| I | | | | | | | | | | | | |
| T | | | | | | | | | | | | |
| L OPEN | AT | HAT | HAT | HAT | P | I | X | HT | HAT | HAT | P | I |
| A CLOSED | HAT | AT | HAT | HAT | P | I | HT | X | HAT | HAT | P | I |
| N EASEL | HAT | HAT | HAT | HAT | P | I | HT | HT | X | HAT | P | I |
| D MODIFIED EASEL | HAT | HAT | HAT | HAT | HAT | AT | HT | HT | HAT | X | P | I |
| S | | | | | | | | | | | | |
| C IMAGE/VIDEO | HAT | HAT | HAT | HAT | P | X | HT | HT | HT | HAT | P | X |
| A | | | | | | | | | | | | |
| P | | | | | | | | | | | | |
| E | | | | | | | | | | | | |
| DOCKED | | | | | | | DOCKING SIGNAL | | | | | |

Key:
H - Hall Effect Sensor(s)
a - accelerometer(s)
T - Timer
P – communications Trigger
I – Image / Video capture Request

FIG. 5B

GRAPHICAL USER INTERFACES CUES FOR OPTIMAL DATAPATH SELECTION

CROSS REFERENCE TO RELATED APPLICATION

The present application claims the benefits of and priority, under 35 U.S.C. §119(e), to U.S. Provisional Application Ser. No. 61/539,884, filed Sep. 27, 2011, entitled "MOBILE DEVICE," which is incorporated herein by this reference in its entirety for all that it teaches teach and for all purposes.

BACKGROUND

A substantial number of handheld computing devices, such as cellular phones, tablets, laptops, and E-Readers, are capable of using multiple networks to upload and download information. Examples include WiFi™, Bluetooth™, and cellular (radio) data communication protocols, including Wimax, HIPERMAN, iBurst, EDGE Evolution, EV-DO, Flash-OFDM, 1G, 2G, 2.5G, 2.75G, 3G, pre-4G, 4G, 5G, UMTS W-CDMA, and UMTS-TDD. These protocols have divergent properties in terms of data transmission speed, cost, and reliability.

Many handheld computing devices can communicate both through WiFi™, Bluetooth™, as well as through a cellular radio protocol. In most cases, the choice of protocol is determined as a function of a fixed hierarchy of radio protocols. The hierarchy is based on expected speed alone. Two common settings on handheld computing devices are: (a) first switch to WiFi™ data throughput whenever a known network is detected in range and (b) second switch to 4G data throughput whenever a known network is detected in range.

While this simple algorithm is relatively effective under a range of usage scenarios, it provides several substantial limitations. It can fail to provide universally the user with optimal data throughput speed. Under a wide range of circumstances, it can lead users to make use of a network having a high per unit data cost without improving the performance of a chosen application or service. It can shunt multiple users onto a single protocol, thereby causing congestion and reducing reliability. A common result is that users pay higher prices for bandwidth, which is in excess of his or her needs at the time.

There is a need for a data communication protocol selection algorithm that more intelligently assess bandwidth requirements and selects a protocol tailored to such requirements. These and other needs are addressed by the various aspects, embodiments, and/or configurations of the present disclosure.

SUMMARY

The present disclosure is directed to computational device, particularly a handheld communication device, that is able to select among plural networks, or data communication protocols, based on one or more factors in addition to or in lieu of network speed. While the disclosure is presented in terms of exemplary embodiments, it should be appreciated that individual aspects of the disclosure can be separately claimed.

In one embodiment, a wireless communication device includes:
  a display to provide graphical information to a user;
  a cellular telephony module to access a cellular network;
  a wireless communication module to access a non-cellular network;
  an antenna configured to be in wireless communication with a plurality of compatible and currently accessible communication networks including the cellular and non-cellular networks;
  a power source and power control module to provide power to the device; and
  a mobile network selector operable to perform one of the following sets of operations:
    provide, by the display, to a user of the wireless communication device, for an identified compatible and currently accessible communication network, network information comprising one or more of network speed, network reliability, network performance, network bandwidth, network throughput, and data transmission cost and receive, from the user for wireless communications by the wireless communication device, a selected compatible and currently accessible communication network from among the plurality of compatible and currently accessible communication networks;
    receive, from the user, a selection of at least one of a preferred network characteristics to be used in selecting, for wireless communications by the wireless communication device, a compatible and currently accessible communication network from among the plurality of compatible and currently accessible communication networks; and
    provide, by the display, to the user, an indicator of which network characteristic was selected by the user to be used by the mobile network selector in selecting, for wireless communications by the wireless communication device, a compatible and currently accessible communication network from among the plurality of compatible and currently accessible communication networks.

The non-cellular network is normally defined by one of the following protocols: Wimax, WiFi™, and Bluetooth™, the cellular network is normally defined by at one of the following radio data communication protocols: HIPERMAN, iBurst, EDGE Evolution, EV-DO, Flash-OFDM, 1G, 2G, 2.5G, 2.75G, 3G, pre-4G, 4G, 5G, UMTS W-CDMA, and UMTS-TDD.

The network characteristic is commonly one or more of network speed, network reliability, network performance, network bandwidth, network throughput, and data transmission cost.

The device can include a gesture capture area, a user configurable area, a task management module, an application manager, and an application store.

The display is typically a touch screen display.

In one configuration, the mobile network selector compares network state information for each of the compatible, currently accessible wireless network with a data transmission resource requirement for an application, service, transaction, and/or user preference, based on predetermined rules and determines if one or more of the compatible, currently accessible networks can satisfy the data transmission resource requirement.

The data transmission resource requirement can include multiple requirements ranked hierarchically in order of importance, such that, if a highest ranked requirement is satisfied, but a second highest ranked requirement is not satisfied, by a selected compatible and currently accessible network, the selected compatible and currently accessible network is eligible for selection. The data transmission requirement comprises one or more of data transmission speed required for adequate performance, network reliability required for adequate performance, total network resources consumed or to be consumed, network performance, and network data usage cost per unit.

In one configuration, the mobile network selector selects a compatible and currently accessible network in response to one or more of a user establishing a network connection and initiating an application or service, a transaction, or network consumptive.

The mobile network selector one or more of:

determines an expected likelihood of the at least one data transmission requirement being satisfied by a selected compatible and currently accessible network within a selected period of time;

outputs a side-by-side comparison of a current and/or expected performance of each of the compatible and currently accessible networks with the at least one data transmission requirement;

assigns a compliance or non-compliance score to each of the plurality of compatible and currently accessible networks;

determines an expected performance of each of the plurality of compatible and currently accessible networks within the selected period of time;

determines a probability of performing and completing a transaction successfully within the selected period of time;

determines an expected cost of the performance and/or completion of the transaction within the selected period of time; and determines an expected cost per unit time of the performance and/or completion of the transaction.

In one configuration, the mobile network selector selects a compatible and currently accessible network during execution of an application, service, or transaction.

In one configuration, a mobile network analyzer in the communication device analyzes a performance of a selected wireless network by at least one of the following techniques: (a) periodically sending a packet through each of the compatible and currently accessible networks, whereby each of the compatible and currently accessible networks is timed for at least one of data packet throughput speed and data packet integrity; (b) transferring a file from the communication device to a selected destination node and measuring a time required to complete the transfer, wherein a throughput is calculated by dividing a file size by a time to get the throughput; (c) pinging a selected destination with a plurality of packets; and (d) accessing performance information from stored by a discrete network node.

In one configuration, the display provides simultaneously to the user and for an identified network, measured values for one or more of network speed, network reliability, network performance, network bandwidth, network throughput, and data transmission cost.

The present disclosure can provide a number of advantages depending on the particular aspect, embodiment, and/or configuration.

For example, the computational device can allow network or protocol selection based on factors other than or in addition to network speed, including current or anticipated user requirements, network reliability, network performance, and data transmission cost.

It can enable the pairing of network with application requirements for optimal application and network performance. As will be appreciated, different networks have differing capabilities and relative advantages and disadvantages when compared to other networks.

It can provide universally the user with optimal data throughput speed.

It can enable users to make use of a network having not only a lower per unit data cost but also an improved performance of a chosen application or service.

It can provide the user with a higher (end-to-end) quality and/or grade of service (e.g., a higher required bit rate, delay, jitter, packet dropping probability, and/or bit error rate) than would otherwise be realized using conventional network selection algorithms.

It can provide the user with a higher quality of experience (e.g., Mean Opinion Score, Perceptual Speech Quality Measure, and/or Perceptual Evaluation of Video Quality) than would otherwise be realized using conventional network selection algorithms.

It can avoid shunting multiple users onto a single protocol and/or network, thereby causing congestion and reducing reliability. The user is not forced to send data along clogged, unreliable network connections while other networks are available.

It can enable users to pay lower prices for bandwidth, because the bandwidth is better suited to his or her needs at the time. Users are not forced to pay higher prices for bandwidth than is necessary for adequate data transmission speed and/or purchase data transmission services in excess of his or her needs at the time.

These and other advantages will be apparent from the disclosure.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably. It is also to be noted that the terms "comprising", "including", and "having" can be used interchangeably.

The term "automatic" and variations thereof, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

The term "bandwidth", "network bandwidth", "data bandwidth", or "digital bandwidth" refer to one or more bit-rate measures, representing the available, communicated, or consumed data communication resources, such as (peak, maximum, net, average, median, etc.) bit rate, information rate, physical layer useful bit rate, channel capacity, and throughput. It is commonly expressed in bits/second or multiples of it (e.g., kilobits/second, megabits/second, and the like). A bit stream's bandwidth is normally proportional to the average consumed signal bandwidth in Hertz, which is sometimes called frequency bandwidth, spectral bandwidth, RF bandwidth, signal bandwidth, or analog bandwidth.

The term "bit rate" refers to the number of bits that are conveyed or processed per unit time.

A cellular network is a radio network distributed over land through cells where each cell includes a fixed location transceiver known as base station. These cells together provide radio coverage over larger geographical areas. User equipment (UE), such as mobile phones, is therefore able to communicate, even if the equipment is moving through cells during transmission.

The term "composited display" refers to a logical structure that defines a display that can encompass one or more screens. A multi-screen display can be associated with a composite display that encompasses all the screens. The composite display can have different display characteristics based on the various orientations of the device.

The term "computer-readable medium" refers to any storage and/or transmission medium that participate in providing instructions to a processor for execution. Such a medium is commonly tangible and non-transient and can take many forms, including but not limited to, non-volatile media, volatile media, and transmission media and includes without limitation random access memory ("RAM"), read only memory ("ROM"), and the like. Non-volatile media includes, for example, NVRAM, or magnetic or optical disks. Volatile media includes dynamic memory, such as main memory. Common forms of computer-readable media include, for example, a floppy disk (including without limitation a Bernoulli cartridge, ZIP drive, and JAZ drive), a flexible disk, hard disk, magnetic tape or cassettes, or any other magnetic medium, magneto-optical medium, a digital video disk (such as CD-ROM), any other optical medium, punch cards, paper tape, any other physical medium with patterns of holes, a RAM, a PROM, and EPROM, a FLASH-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored. Computer-readable storage medium commonly excludes transient storage media, particularly electrical, magnetic, electromagnetic, optical, magneto-optical signals.

The term "cost" refers to one or both of resource consumption and monetary cost (which is typically based on per-minute or per-megabyte fee rather than flat rate) to a user in connection with communicating data. Typically, the resource consumed in communicating data is directly proportional to the monetary cost to the user from communicating the data.

The term "desktop" refers to a metaphor used to portray systems. A desktop is generally considered a "surface" that typically includes pictures, called icons, widgets, folders, etc. that can activate show application or services, windows, cabinets, files, folders, documents, and other graphical items. The icons are generally selectable to initiate a task through user interface interaction to allow a user to execute application or services or conduct other operations.

The terms "determine", "calculate" and "compute," and variations thereof, are used interchangeably and include any type of methodology, process, mathematical operation or technique.

The term "display" refers to a portion of one or more screens used to display the output of a computer to a user. A display may be a single-screen display or a multi-screen display, referred to as a composite display. A composite display can encompass the touch sensitive display of one or more screens. A single physical screen can include multiple displays that are managed as separate logical displays. Thus, different content can be displayed on the separate displays although part of the same physical screen.

The term "displayed image" refers to an image produced on the display. A typical displayed image is a window or desktop. The displayed image may occupy all or a portion of the display.

The term "display orientation" refers to the way in which a rectangular display is oriented by a user for viewing. The two most common types of display orientation are portrait and landscape. In landscape mode, the display is oriented such that the width of the display is greater than the height of the display (such as a 4:3 ratio, which is 4 units wide and 3 units tall, or a 16:9 ratio, which is 16 units wide and 9 units tall). Stated differently, the longer dimension of the display is oriented substantially horizontal in landscape mode while the shorter dimension of the display is oriented substantially vertical. In the portrait mode, by contrast, the display is oriented such that the width of the display is less than the height of the display. Stated differently, the shorter dimension of the display is oriented substantially horizontal in the portrait mode while the longer dimension of the display is oriented substantially vertical.

The term "gesture" refers to a user action that expresses an intended idea, action, meaning, result, and/or outcome. The user action can include manipulating a device (e.g., opening or closing a device, changing a device orientation, moving a trackball or wheel, etc.), movement of a body part in relation to the device, movement of an implement or tool in relation to the device, audio inputs, etc. A gesture may be made on a device (such as on the screen) or with the device to interact with the device.

The term "gesture capture" refers to a sense or otherwise a detection of an instance and/or type of user gesture. The gesture capture can occur in one or more areas of the screen, A gesture region can be on the display, where it may be referred to as a touch sensitive display or off the display where it may be referred to as a gesture capture area.

The term "module" refers to any known or later developed hardware, software, firmware, artificial intelligence, fuzzy logic, or combination of hardware and software that is capable of performing the functionality associated with that element.

A "multi-screen application" refers to an application that is capable of multiple modes. The multi-screen application mode can include, but is not limited to, a single screen mode (where the application is displayed on a single screen) or a composite display mode (where the application is displayed on two or more screens). A multi-screen application can have different layouts optimized for the mode. Thus, the multi-screen application can have different layouts for a single screen or for a composite display that can encompass two or more screens. The different layouts may have different screen/display dimensions and/or configurations on which the user interfaces of the multi-screen applications can be rendered. The different layouts allow the application to optimize the application's user interface for the type of display, e.g., single screen or multiple screens. In single screen mode, the multi-screen application may present one window pane of information. In a composite display mode, the multi-screen application may present multiple window panes of information or may provide a larger and a richer presentation because there is more space for the display contents. The multi-screen applications may be designed to adapt dynamically to changes in the device and the mode depending on which display (single or composite) the system assigns to the multi-screen application. In alternative embodiments, the user can use a gesture to request the application transition to a different mode, and, if a display is available for the requested mode, the device can allow the application to move to that display and transition modes.

The term "reliability" or "network reliability" refers to reliability of a network in communicating data. A reliable protocol is generally one that provides reliability properties with respect to the delivery of data to the intended recipient(s), as opposed to an unreliable protocol, which generally does not provide notifications to the sender as to the delivery of transmitted data. A reliable multicast protocol may ensure reliability on a per-recipient basis, as well as provide properties that relate the delivery of data to different recipients, such as "at least once" (i.e., at least one copy of the message is guaranteed to be delivered to the recipient), last copy recall (i.e., as long as at least a single copy of a message remains available at any of the recipients, every other recipient that does not fail eventually also receives a copy), total order, atomicity (i.e., if at least a single copy of a message has been delivered to a recipient, all other recipients will eventually receive a copy of the message), or virtual synchrony. Reliable protocols typically incur more overhead than unreliable protocols, and as a result, are slower and less scalable. This often is not an issue for unicast protocols, but it may be a problem for multicast protocols. Examples of reliable protocols include TCP (a connection-oriented unicast protocol) and group communication systems (such as ISIS, Appia framework, Spread, Jgroups, and QuickSilver Multicast). Examples of unreliable protocols include UDP, ATM and Frame Relay.

A "satellite positioning system" or "SPS" is a system of satellites that provide autonomous geo-spatial positioning with global or regional coverage. It allows small electronic receivers to determine their location (longitude, latitude, and altitude) to within a few meters using time signals transmitted along a line-of-sight by radio from satellites. SPS examples include the Global Positioning System ("GPS"), GLONASS, the Galileo Positioning System, DORIS, IRNSS, QZSS, and COMPASS.

The term "screen," "touch screen," or "touchscreen" refers to a physical structure that includes one or more hardware components that provide the device with the ability to render a user interface and/or receive user input. A screen can encompass any combination of gesture capture region, a touch sensitive display, and/or a configurable area. The device can have one or more physical screens embedded in the hardware. However a screen may also include an external peripheral device that may be attached and detached from the device. In embodiments, multiple external devices may be attached to the device. Thus, in embodiments, the screen can enable the user to interact with the device by touching areas on the screen and provides information to a user through a display. The touch screen may sense user contact in a number of different ways, such as by a change in an electrical parameter (e.g., resistance or capacitance), acoustic wave variations, infrared radiation proximity detection, light variation detection, and the like. In a resistive touch screen, for example, normally separated conductive and resistive metallic layers in the screen pass an electrical current. When a user touches the screen, the two layers make contact in the contacted location, whereby a change in electrical field is noted and the coordinates of the contacted location calculated. In a capacitive touch screen, a capacitive layer stores electrical charge, which is discharged to the user upon contact with the touch screen, causing a decrease in the charge of the capacitive layer. The decrease is measured, and the contacted location coordinates determined. In a surface acoustic wave touch screen, an acoustic wave is transmitted through the screen, and the acoustic wave is disturbed by user contact. A receiving transducer detects the user contact instance and determines the contacted location coordinates.

A "single-screen application" refers to an application that is capable of single screen mode. Thus, the single-screen application can produce only one window and may not be capable of different modes or different display dimensions. A single-screen application may not be capable of the several modes discussed with the multi-screen application.

The term "throughput" or "network throughput" is the average rate of successful message delivery over a communication channel. The system throughput or aggregate throughput is the sum of the data rates that are delivered to all terminals in a network.

The term "network performance" refers to service quality as seen by the customer or user.

The term "window" refers to a, typically rectangular, displayed image on at least part of a display that contains or provides content different from the rest of the screen. The window may obscure the desktop.

It shall be understood that the term "means" shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the disclosure, brief description of the drawings, detailed description, abstract, and claims themselves.

The preceding is a simplified summary of the disclosure to provide an understanding of some aspects of the disclosure. This summary is neither an extensive nor exhaustive overview of the disclosure and its various aspects, embodiments, and/or configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and/or configurations of the disclosure are possible utilizing, alone or in combination, one or more of the features set forth above or described in detail below.

BRIEF DESCRIPTION OF THE DRAWINGS

FIG. 4C is a third representation of an embodiment of a device configuration generated in response to the device state;

FIG. 4D is a fourth representation of an embodiment of a device configuration generated in response to the device state;

FIG. 4E is a fifth representation of an embodiment of a device configuration generated in response to the device state;

FIG. 4F is a sixth representation of an embodiment of a device configuration generated in response to the device state;

FIG. 4G is a seventh representation of an embodiment of a device configuration generated in response to the device state;

FIG. 5B is a table of an embodiment of the state model for the device based on the device's orientation and/or configuration;

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

Presented herein are embodiments of a computational device. The device can be a wireless communications device, such as a cellular telephone, tablet computer, e-reader, laptop, personal digital assistant ("PDA"), or other smart device. The device can include one or more screens that are oriented to provide several unique display configurations. Further, the device can receive user input in unique ways. The overall design and functionality of the device provides for an enhanced user experience making the device more useful and more efficient.

Figure 1:
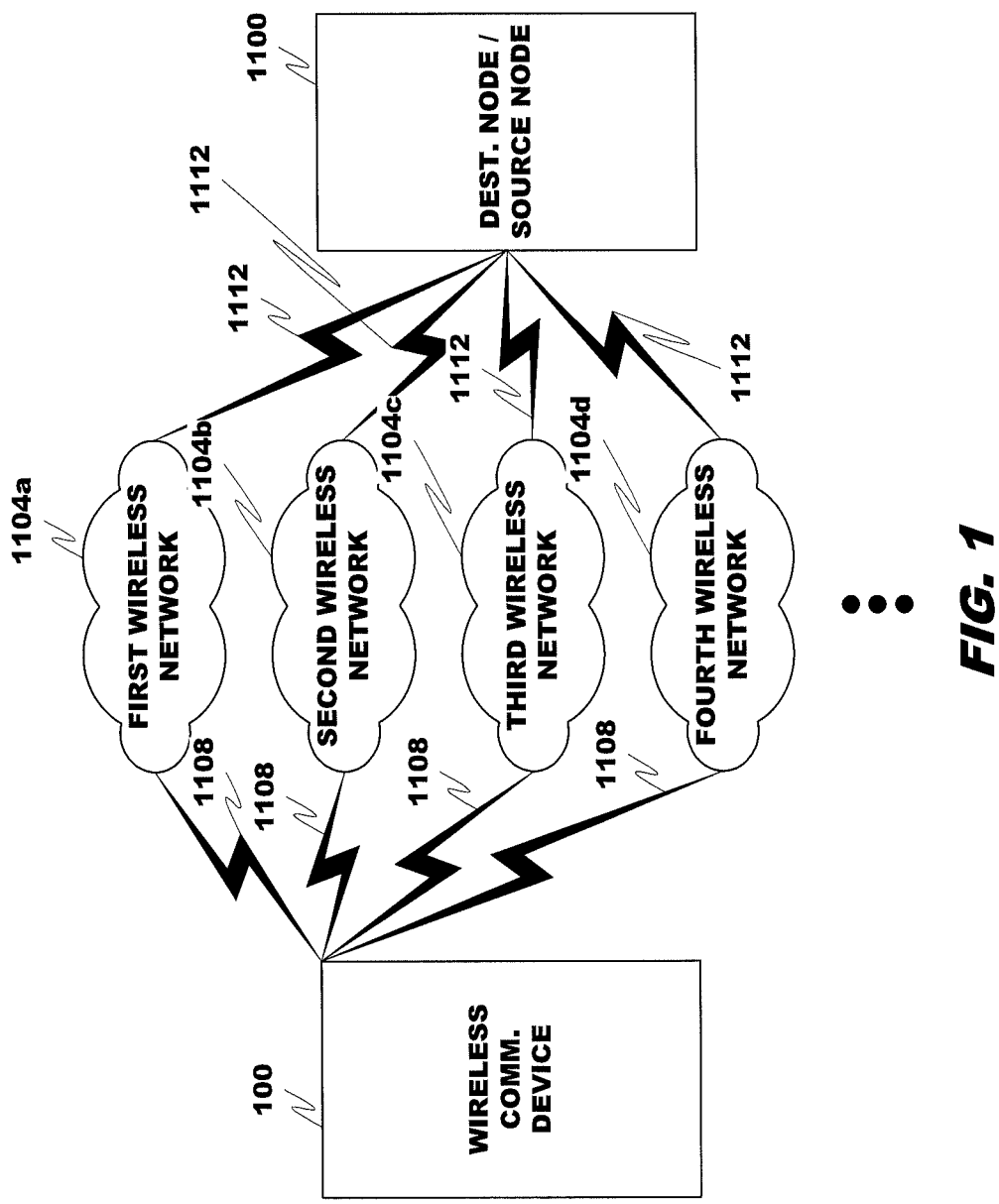
FIG. 1 is a block diagram of a network according to an embodiment of the present disclosure.

Environment:

FIG. 1 depicts a network according to an embodiment. A wireless communication device 100 is in wireless communication with a destination or source node 1100 via plural networks, namely first wireless network 1104a, second wireless network 1104b, third wireless network 1104c, fourth wireless network 1104d, . . . While the link 1108 is wireless, the link 1112 can be wired or wireless.

Each of the first, second, third, fourth, . . . wireless networks is associated with a different data communication protocol. Examples include WiFi™, Bluetooth™, and cellular (radio) data communication protocols, including Wimax, HIPERMAN, iBurst, EDGE Evolution, EV-DO, Flash-OFDM, 1G, 2G, 2.5G, 2.75G, 3G, pre-4G, 4G, 5G, UMTS W-CDMA, and UMTS-TDD. The various protocols differ in one or more of the following respects: data transmission speed, cost, and reliability.

As described below, the wireless communication device 100 is able to select, based on predetermined or pre-configured rules or current user input, an optimal wireless network from among the plural wireless networks for data communication (either upload or download). The selection can be based on a myriad of factors other than or in addition to network speed, including without limitation current or anticipated user requirements, network reliability, network performance, and data transmission cost.

Exemplary Communication Device:

FIGS. 2, 3A-B, 4A-B, 5A-J, and 6A-B illustrate an exemplary wireless handheld communication device 100 in accordance with embodiments of the present disclosure. While the communication device 100 is described with reference to this particular device configuration, the disclosure is not limited to this communication device configuration. The concepts presented apply not only to this device configuration but also to innumerable other device configurations in the form of (other) smart cellular telephones, tablet computers, e-readers, laptops, personal digital assistants ("PDA's"), and other smart devices having one or more virtual, logical or physical screens.

In accordance with the exemplary communication device embodiment and as shown in FIGS. 2, 3A-B, 4A-B, 5A-J, and 6A-B, the exemplary communication device 100 can be positioned in a number of different ways, each of which provides different functionality to a user. The exemplary communication device 100 is a multi-screen device that includes a primary screen 104 and a secondary screen 108, both of which are touch sensitive. In embodiments, the entire front surface of screens 104 and 108 may be touch sensitive and capable of receiving input by a user touching the front surface of the screens 104 and 108. Primary screen 104 includes touch sensitive display 110, which, in addition to being touch sensitive, also displays information to a user. Secondary screen 108 includes touch sensitive display 114, which also displays information to a user. In other embodiments, screens 104 and 108 may include more than one display area.

Primary screen 104 also includes a configurable area 112 that has been configured for specific inputs when the user touches portions of the configurable area 112. Secondary screen 108 also includes a configurable area 116 that has been configured for specific inputs. Areas 112a and 116a have been configured to receive a "back" input indicating that a user would like to view information previously displayed. Areas 112b and 116b have been configured to receive a "menu" input indicating that the user would like to view options from a menu. Areas 112c and 116c have been configured to receive a "home" input indicating that the user would like to view information associated with a "home" view. In other embodiments, areas 112a-c and 116a-c may be configured, in addition to the configurations described above, for other types of specific inputs including controlling features of exemplary communication device 100, some non-limiting examples including selecting a wireless communication network for data communication, adjusting overall system power, adjusting the volume, adjusting the brightness, adjusting the vibration, selecting of displayed items (on either of screen 104 or 108), operating a camera, operating a microphone, and initiating/terminating of telephone calls. Also, in some embodiments, areas 112a-C and 116a-C may be configured for specific inputs depending upon the application running on exemplary communication device 100 and/or information displayed on touch sensitive displays 110 and/or 114.

In addition to touch sensing, primary screen 104 and secondary screen 108 may also include areas that receive input from a user without requiring the user to touch the display area of the screen. For example, primary screen 104 includes gesture capture area 120, and secondary screen 108 includes gesture capture area 124. These areas are able to receive input by recognizing gestures made by a user without the need for the user to actually touch the surface of the display area. In comparison to touch sensitive displays 110 and 114, the gesture capture areas 120 and 124 are commonly not capable of rendering a displayed image.

Figure 4A:
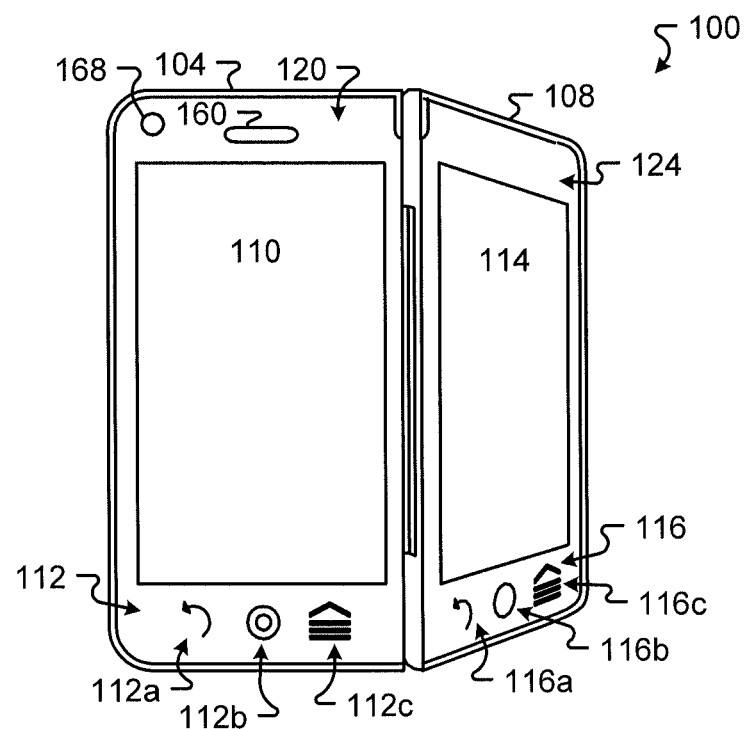
FIG. 4A is a first representation of an embodiment of a device configuration generated in response to the device state.
Figure 4B:
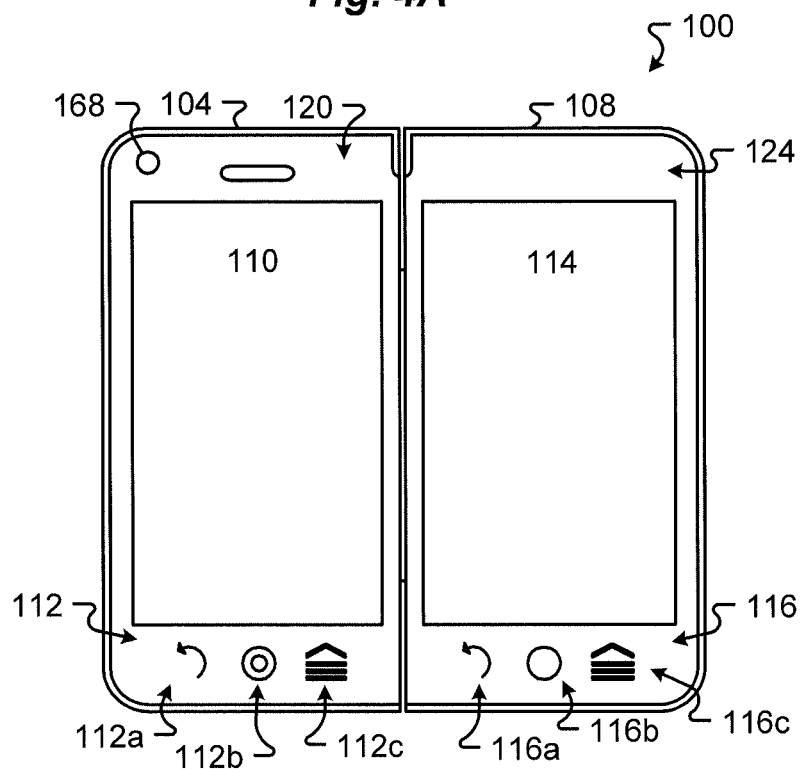
FIG. 4B is a second representation of an embodiment of a device configuration generated in response to the device state.

The two screens 104 and 108 are connected together with a hinge 128, shown clearly in FIG. 4C (illustrating a back view of exemplary communication device 100). Hinge 128, in the embodiment shown in FIGS. 4A-4J, is a center hinge that connects screens 104 and 108 so that when the hinge is closed, screens 104 and 108 are juxtaposed (i.e., side-by-side) as shown in FIG. 4B (illustrating a front view of exemplary communication device 100). Hinge 128 can be opened to position the two screens 104 and 108 in different relative positions to each other. As described in greater detail below, the exemplary communication device 100 may have different functionalities depending on the relative positions of screens 104 and 108.

FIG. 4D illustrates the right side of exemplary communication device 100. As shown in FIG. 1D, secondary screen 108 also includes a card slot 132 and a port 136 on its side. Card slot 132 in embodiments, accommodates different types of cards including a subscriber identity module (SIM). Port 136 in embodiments is an input/output port (I/O port) that allows exemplary communication device 100 to be connected to other peripheral devices, such as a display, keyboard, or printing device. As can be appreciated, these are merely some examples and in other embodiments exemplary communication device 100 may include other slots and ports such as slots and ports for accommodating additional memory devices and/or for connecting other peripheral devices. Also shown in FIG. 4D is an audio jack 140 that accommodates a tip, ring, sleeve (TRS) connector for example to allow a user to utilize headphones or a headset.

Exemplary communication device 100 also includes a number of buttons 158. For example, FIG. 4E illustrates the left side of exemplary communication device 100. As shown in FIG. 4E, the side of primary screen 104 includes three buttons 144, 148, and 152, which can be configured for specific inputs. For example, buttons 144, 148, and 152 may be configured to, in combination or alone, control a number of aspects of exemplary communication device 100. Some non-limiting examples include overall system power, volume, brightness, vibration, selection of displayed items (on either of screen 104 or 108), a camera, a microphone, and initiation/termination of telephone calls. In some embodiments, instead of separate buttons two buttons may be combined into a rocker button. This arrangement is useful in situations where the buttons are configured to control features such as volume or brightness. In addition to buttons 144, 148, and 152, exemplary communication device 100 also includes a button 156, shown in FIG. 4F, which illustrates the top of exemplary communication device 100. In one embodiment, button 156 is configured as an on/off button used to control overall system power to exemplary communication device 100. In other embodiments, button 156 is configured to, in addition to or in lieu of controlling system power, control other aspects of exemplary communication device 100. In some embodiments, one or more of the buttons 144, 148, 152, and 156 are capable of supporting different user commands. By way of example, a normal press has a duration commonly of less than about 1 second and resembles a quick tap. A medium press has a duration commonly of 1 second or more but less than about 12 seconds. A long press has a duration commonly of about 12 seconds or more. The function of the buttons is normally specific to the application that is currently in focus on the respective display 110 and 114.

There are also a number of hardware components within exemplary communication device 100. As illustrated in FIG. 4C, exemplary communication device 100 includes a speaker 160 and a microphone 164. Exemplary communication device 100 also includes a camera 168 (FIG. 4B). Additionally, exemplary communication device 100 includes two position sensors 172A and 172B, which are used to determine the relative positions of screens 104 and 108. In one embodiment, position sensors 172A and 172B are Hall effect sensors. However, in other embodiments other sensors can be used in addition to or in lieu of the Hall effect sensors. An accelerometer 176 may also be included as part of exemplary communication device 100 to determine the orientation of the exemplary communication device 100 and/or the orientation of screens 104 and 108. Additional internal hardware components that may be included in exemplary communication device 100 are described below with respect to FIG. 2.

The overall design of exemplary communication device 100 allows it to provide additional functionality not available in other communication devices. Some of the functionality is based on the various positions and orientations that exemplary communication device 100 can have. As shown in FIGS. 4B-4G, exemplary communication device 100 can be operated in an "open" position where screens 104 and 108 are juxtaposed. This position allows a large display area for displaying information to a user. When position sensors 172A and 172B determine that exemplary communication device 100 is in the open position, they can generate a signal that can be used to trigger different events such as displaying information on both screens 104 and 108. Additional events may be triggered if accelerometer 176 determines that exemplary communication device 100 is in a portrait position (FIG. 4B) as opposed to a landscape position (not shown).

Figure 4H:
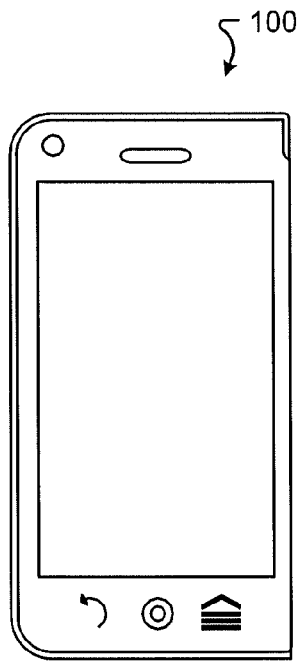
FIG. 4H is a eighth representation of an embodiment of a device configuration generated in response to the device state.

In addition to the open position, exemplary communication device 100 may also have a "closed" position illustrated in FIG. 4H. Again, position sensors 172A and 172B can generate a signal indicating that exemplary communication device 100 is in the "closed" position. This can trigger an event that results in a change of displayed information on screen 104 and/or 108. For example, exemplary communication device 100 may be programmed to stop displaying information on one of the screens, e.g., screen 108, since a user can only view one screen at a time when exemplary communication device 100 is in the "closed" position. In other embodiments, the signal generated by position sensors 172A and 172B, indicating that the exemplary communication device 100 is in the "closed" position, can trigger exemplary communication device 100 to answer an incoming telephone call. The "closed" position can also be a preferred position for utilizing the exemplary communication device 100 as a mobile phone.

Figure 4I:
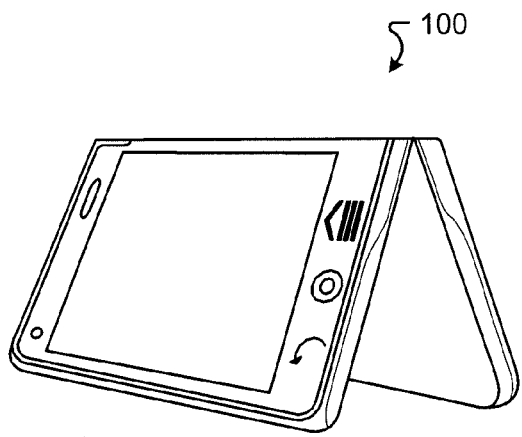
FIG. 4I is a ninth representation of an embodiment of a device configuration generated in response to the device state.

Exemplary communication device 100 can also be used in an "easel" position which is illustrated in FIG. 4I. In the "easel" position, screens 104 and 108 are angled with respect to each other and facing outward with the edges of screens 104 and 108 substantially horizontal. In this position, exemplary communication device 100 can be configured to display information on both screens 104 and 108 to allow two users to simultaneously interact with exemplary communication device 100. When exemplary communication device 100 is in the "easel" position, sensors 172A and 172B generate a signal indicating that the screens 104 and 108 are positioned at an angle to each other, and the accelerometer 176 can generate a signal indicating that exemplary communication device 100 has been placed so that the edge of screens 104 and 108 are substantially horizontal. The signals can then be used in combination to generate events that trigger changes in the display of information on screens 104 and 108.

Figure 4J:
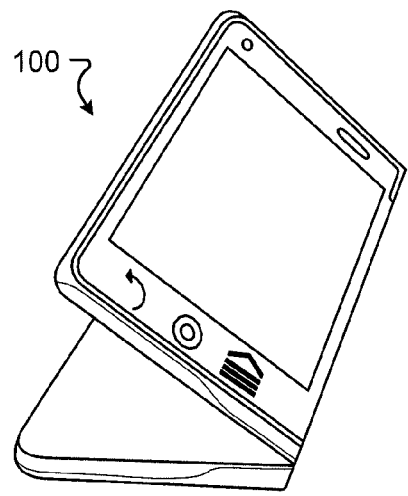
FIG. 4J is a tenth representation of an embodiment of a device configuration generated in response to the device state.

FIG. 4J illustrates exemplary communication device 100 in a "modified easel" position. In the "modified easel" position, one of screens 104 or 108 is used as a stand and is faced down on the surface of an object such as a table. This position provides a convenient way for information to be displayed to a user in landscape orientation. Similar to the easel position, when exemplary communication device 100 is in the "modified easel" position, position sensors 172A and 172B generate a signal indicating that the screens 104 and 108 are positioned at an angle to each other. The accelerometer 176 would generate a signal indicating that exemplary communication device 100 has been positioned so that one of screens 104 and 108 is faced downwardly and is substantially horizontal. The signals can then be used to generate events that trigger changes in the display of information of screens 104 and 108. For example, information may not be displayed on the screen that is face down since a user cannot see the screen.

Transitional states are also possible. When the position sensors 172A and B and/or accelerometer indicate that the screens are being closed or folded (from open), a closing transitional state is recognized. Conversely when the position sensors 172A and B indicate that the screens are being opened or folded (from closed), an opening transitional state is recognized. The closing and opening transitional states are typically time-based, or have a maximum time duration from a sensed starting point. Normally, no user input is possible when one of the closing and opening states is in effect. In this manner, incidental user contact with a screen during the closing or opening function is not misinterpreted as user input. In embodiments, another transitional state is possible when the exemplary communication device 100 is closed. This additional transitional state allows the display to switch from one screen 104 to the second screen 108 when the exemplary communication device 100 is closed based on some user input, e.g., a double tap on the screen 110,114.

As can be appreciated, the description of exemplary communication device 100 is made for illustrative purposes only, and the embodiments are not limited to the specific mechanical features shown in FIGS. 4A-4J and described above. In other embodiments, exemplary communication device 100 may include additional features, including one or more additional buttons, slots, display areas, hinges, and/or locking mechanisms. Additionally, in embodiments, the features described above may be located in different parts of exemplary communication device 100 and still provide similar functionality. Therefore, FIGS. 4A-4J and the description provided above are nonlimiting.

Figure 2:
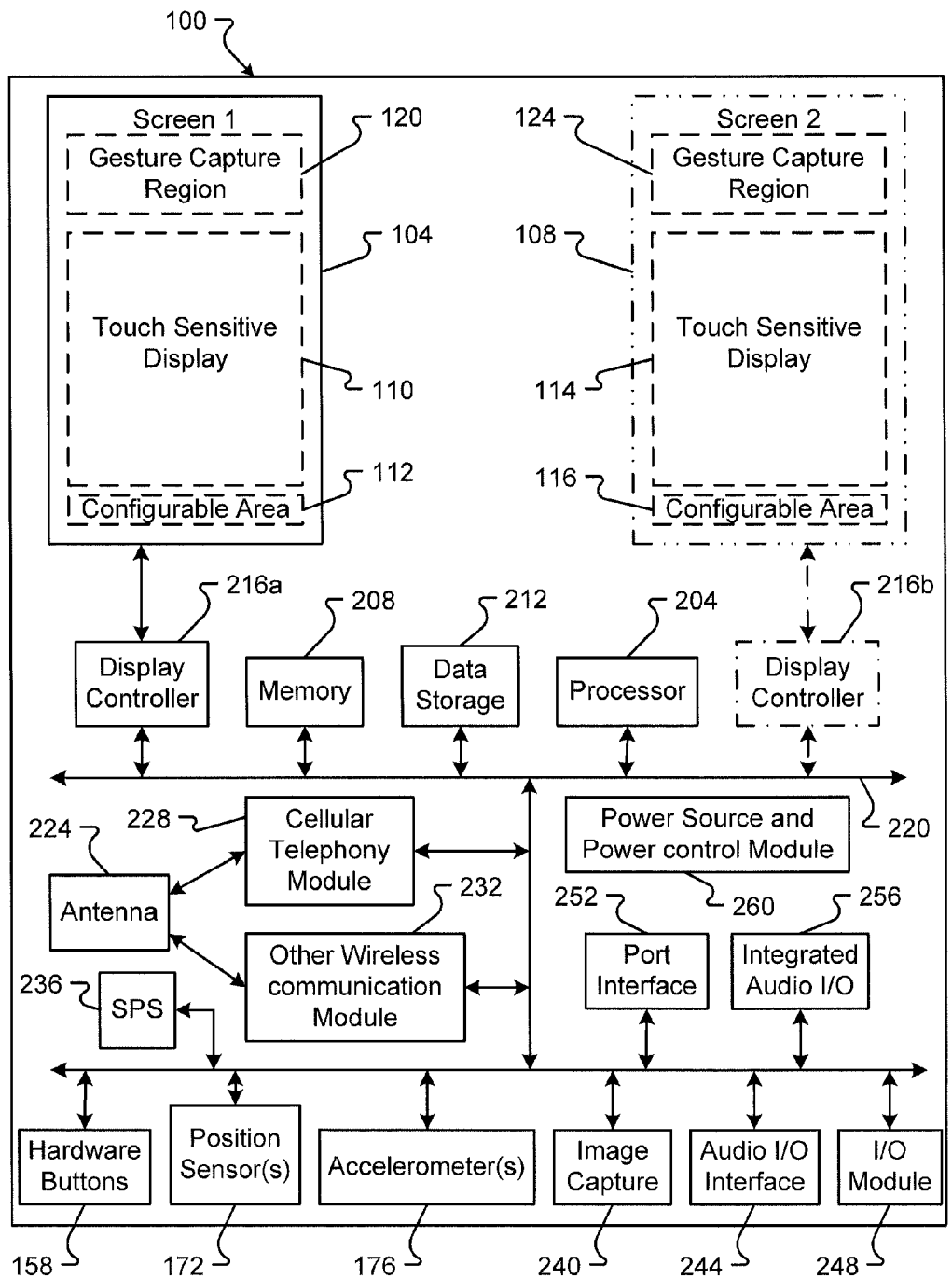
FIG. 2 is a block diagram of an embodiment of the hardware of the device.

Hardware Features:

FIG. 2 illustrates components of an exemplary communication device 100 in accordance with embodiments of the present disclosure. In general, the exemplary communication device 100 includes a primary screen 104 and a (optional) secondary screen 108. While the primary screen 104 and its components are normally enabled in both the opened and closed positions or states, the secondary screen 108 and its components are normally enabled in the opened state but disabled in the closed state. However, even when in the closed state a user or application triggered interrupt (such as in response to a phone application or camera application operation) can flip the active screen, or disable the primary screen 104 and enable the secondary screen 108, by a suitable command. Each screen 104, 108 can be touch sensitive and can include different operative areas. For example, a first operative area, within each touch sensitive screen 104 and 108, may comprise a touch sensitive display 110, 114. In general, the touch sensitive display 110, 114 may comprise a full color, touch sensitive display. A second area within each touch sensitive screen 104 and 108 may comprise a gesture capture region 120, 124. The gesture capture region 120, 124 may comprise an area or region that is outside of the touch sensitive display 110, 114 area, and that is capable of receiving input, for example in the form of gestures provided by a user. However, the gesture capture region 120, 124 does not include pixels that can perform a display function or capability.

A third region of the touch sensitive screens 104 and 108 may comprise a configurable area 112, 116. The configurable area 112, 116 is capable of receiving input and has display or limited display capabilities. In embodiments, the configurable area 112, 116 may present different input options to the user. For example, the configurable area 112, 116 may display buttons or other relatable items. Moreover, the identity of displayed buttons, or whether any buttons are displayed at all within the configurable area 112, 116 of a touch sensitive screen 104 or 108, may be determined from the context in which the exemplary communication device 100 is used and/or operated. In an exemplary embodiment, the touch sensitive screens 104 and 108 comprise liquid crystal display devices extending across at least those regions of the touch sensitive screens 104 and 108 that are capable of providing visual output to a user, and a capacitive input matrix over those regions of the touch sensitive screens 104 and 108 that are capable of receiving input from the user.

One or more display controllers 216*a*, 216*b* may be provided for controlling the operation of the touch sensitive screens 104 and 108, including input (touch sensing) and output (display) functions. In the exemplary embodiment illustrated in FIG. 2, a separate touch screen controller 216*a* or 216*b* is provided for each touch screen 104 and 108. In accordance with alternate embodiments, a common or shared touch screen controller 216 may be used to control each of the included touch sensitive screens 104 and 108. In accordance with still other embodiments, the functions of a touch screen controller 216 may be incorporated into other components, such as a processor 204.

The processor 204 may comprise a general purpose programmable processor or controller for executing application programming or instructions. In accordance with at least some embodiments, the processor 204 may include multiple processor cores, and/or implement multiple virtual processors. In accordance with still other embodiments, the processor 204 may include multiple physical processors. As a particular example, the processor 204 may comprise a specially configured application specific integrated circuit (ASIC) or other integrated circuit, a digital signal processor, a controller, a hardwired electronic or logic circuit, a programmable logic device or gate array, a special purpose computer, or the like. The processor 204 generally functions to run programming code or instructions implementing various functions of the device 100.

A communication exemplary communication device 100 may also include memory 208 for use in connection with the execution of application programming or instructions by the processor 204, and for the temporary or long term storage of program instructions and/or data. As examples, the memory 208 may comprise RAM, DRAM, SDRAM, or other solid state memory. Alternatively or in addition, data storage 212 may be provided. Like the memory 208, the data storage 212 may comprise a solid state memory device or devices. Alternatively or in addition, the data storage 212 may comprise a hard disk drive or other random access memory.

In support of communications functions or capabilities, the exemplary communication device 100 can include a cellular telephony module 228. As examples, the cellular telephony module 228 can comprise a GSM, CDMA, FDMA and/or analog cellular telephony transceiver capable of supporting voice, multimedia and/or data transfers over a cellular network. Alternatively or in addition, the exemplary communication device 100 can include an additional or other wireless communications module 232. As examples, the other wireless communications module 232 can comprise a Wi-Fi™, Bluetooth™, WiMax, infrared, or other wireless communications link. The cellular telephony module 228 and the other wireless communications module 232 can each be associated with a shared or a dedicated antenna 224.

A port interface 252 may be included. The port interface 252 may include proprietary or universal ports to support the interconnection of the exemplary communication device 100 to other devices or components, such as a dock, which may or may not include additional or different capabilities from those integral to the exemplary communication device 100. In addition to supporting an exchange of communication signals between the exemplary communication device 100 and another device or component, the docking port 136 and/or port interface 252 can support the supply of power to or from the exemplary communication device 100. The port interface 252 also comprises an intelligent element that comprises a docking module for controlling communications or other interactions between the exemplary communication device 100 and a connected device or component.

An input/output module 248 and associated ports may be included to support communications over wired networks or links, for example with other communication devices, server devices, and/or peripheral devices. Examples of an input/output module 248 include an Ethernet port, a Universal Serial Bus (USB) port, Institute of Electrical and Electronics Engineers (IEEE) 1394, or other interface.

An audio input/output interface/device(s) 244 can be included to provide analog audio to an interconnected speaker or other device, and to receive analog audio input from a connected microphone or other device. As an example, the audio input/output interface/device(s) 244 may comprise an associated amplifier and analog to digital converter. Alternatively or in addition, the exemplary communication device 100 can include an integrated audio input/output device 256 and/or an audio jack for interconnecting an external speaker or microphone. For example, an integrated speaker and an integrated microphone can be provided, to support near talk or speaker phone operations.

Hardware buttons 158 can be included for example for use in connection with certain control operations. Examples include a master power switch, volume control, etc., as described in conjunction with FIGS. 4A through 4J. One or more image capture interfaces/devices 240, such as a camera, can be included for capturing still and/or video images. Alternatively or in addition, an image capture interface/device 240 can include a scanner or code reader. An image capture interface/device 240 can include or be associated with additional elements, such as a flash or other light source.

The exemplary communication device 100 can also include a satellite positioning system (SPS) receiver 236. In accordance with embodiments of the present disclosure, the SPS receiver 236 may further comprise an SPS module that is capable of providing absolute location information to other components of the exemplary communication device 100. An accelerometer(s) 176 may also be included. For example, in connection with the display of information to a user and/or other functions, a signal from the accelerometer 176 can be used to determine an orientation and/or format in which to display that information to the user.

Embodiments of the present disclosure can also include one or more position sensor(s) 172. The position sensor 172 can provide a signal indicating the position of the touch sensitive screens 104 and 108 relative to one another. This information can be provided as an input, for example to a user interface application, to determine an operating mode, characteristics of the touch sensitive displays 110, 114, and/or other exemplary communication device 100 operations. As examples, a screen position sensor 172 can comprise a series of Hall effect sensors, a multiple position switch, an optical switch, a Wheatstone bridge, a potentiometer, or other arrangement capable of providing a signal indicating of multiple relative positions the touch screens are in.

Communications between various components of the exemplary communication device 100 can be carried by one or more buses 222. In addition, power can be supplied to the components of the exemplary communication device 100 from a power source and/or power control module 260. The power control module 260 can, for example, include a battery, an AC to DC converter, power control logic, and/or ports for interconnecting the exemplary communication device 100 to an external source of power.

Figure 5A:
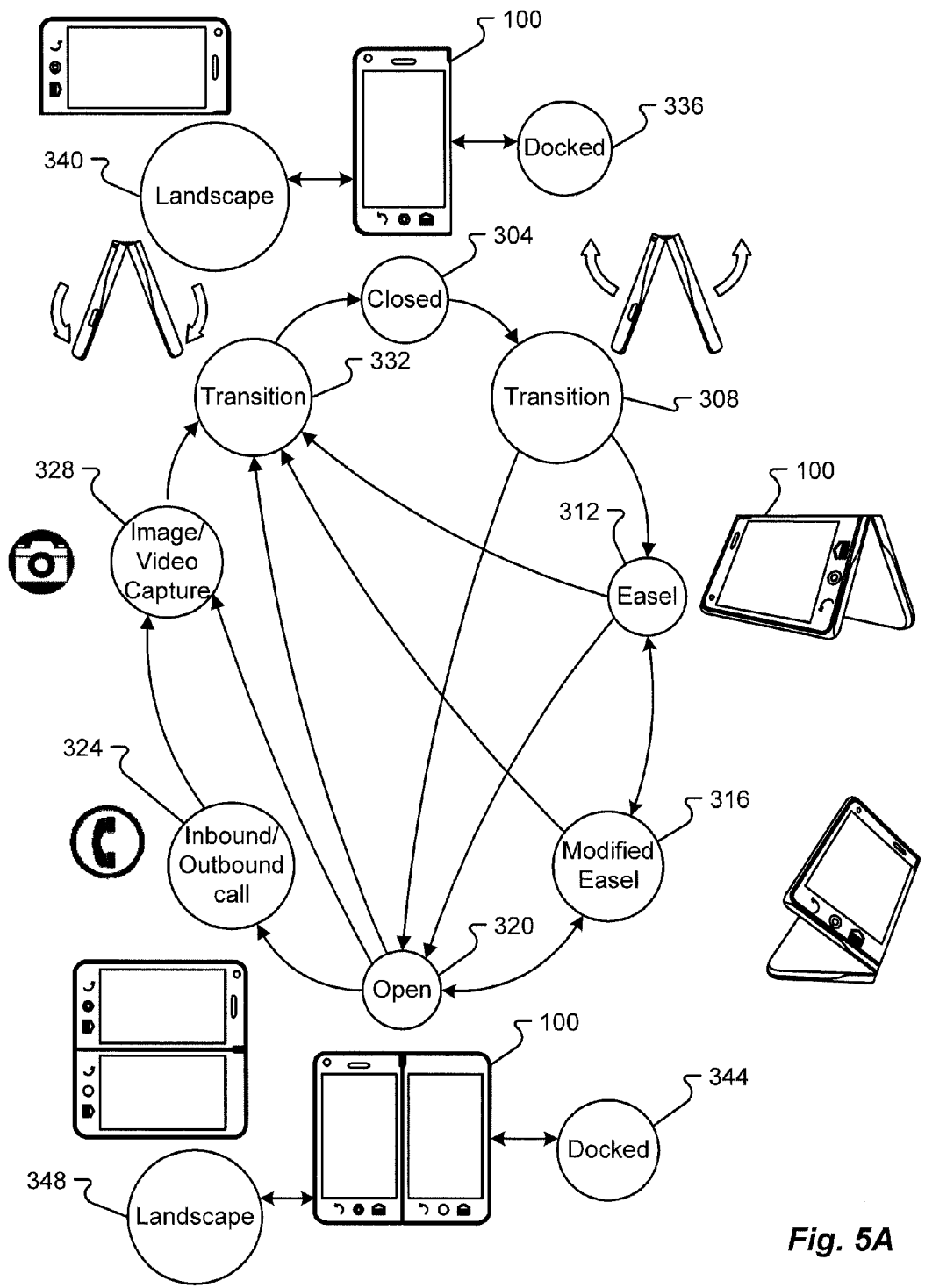
FIG. 5A is a block diagram of an embodiment of a state model for the device based on the device's orientation and/or configuration.

Exemplary Communication Device State:

FIGS. 5A and 5B represent illustrative states of exemplary communication device 100. While a number of illustrative states are shown, and transitions from a first state to a second state, it is to be appreciated that the illustrative state diagram may not encompass all possible states and/or all possible transitions from a first state to a second state. As illustrated in FIG. 5A, the various arrows between the states (illustrated by the state represented in the circle) represent a physical change that occurs to the exemplary communication device 100, that is detected by one or more of hardware and software, the detection triggering one or more of a hardware and/or software interrupt that is used to control and/or manage one or more functions of exemplary communication device 100.

As illustrated in FIG. 5A, there are twelve exemplary "physical" states: closed 304, transition 308 (or opening transitional state), easel 312, modified easel 316, open 320, inbound/outbound call or communication 324, image/video capture 328, transition 332 (or closing transitional state), landscape 340, docked 336, docked 344 and landscape 348. Next to each illustrative state is a representation of the physical state of the exemplary communication device 100 with the exception of states 324 and 328, where the state is generally symbolized by the international icon for a telephone and the icon for a camera, respectfully.

In state 304, the device is in a closed state with the exemplary communication device 100 generally oriented in the portrait direction with the primary screen 104 and the secondary screen 108 back-to-back in different planes (see FIG. 4H). From the closed state, the exemplary communication device 100 can enter, for example, docked state 336, where the exemplary communication device 100 is coupled with a docking station, docking cable, or in general docked or associated with one or more other devices or peripherals, or the landscape state 340, where the exemplary communication device 100 is generally oriented with the primary screen 104 facing the user, and the primary screen 104 and the secondary screen 108 being back-to-back.

In the closed state, the device can also move to a transitional state where the device remains closed by the display is moved from one screen 104 to another screen 108 based on a user input, e.g., a double tap on the screen 110, 114. Still another embodiment includes a bilateral state. In the bilateral state, the device remains closed, but a single application displays at least one window on both the first display 110 and the second display 114. The windows shown on the first and second display 110, 114 may be the same or different based on the application and the state of that application. For example, while acquiring an image with a camera, the device may display the view finder on the first display 110 and displays a preview for the photo subjects (full screen and mirrored left-to-right) on the second display 114.

In state 308, a transition state from the closed state 304 to the semi-open state or easel state 312, the exemplary communication device 100 is shown opening with the primary screen 104 and the secondary screen 108 being rotated around a point of axis coincidence with the hinge. Upon entering the easel state 312, the primary screen 104 and the secondary screen 108 are separated from one another such that, for example, the exemplary communication device 100 can sit in an easel-like configuration on a surface.

In state 316, known as the modified easel position, the exemplary communication device 100 has the primary screen 104 and the secondary screen 108 in a similar relative relationship to one another as in the easel state 312, with the difference being one of the primary screen 104 or the secondary screen 108 are placed on a surface as shown.

State 320 is the open state where the primary screen 104 and the secondary screen 108 are generally on the same plane. From the open state, the exemplary communication device 100 can transition to the docked state 344 or the open landscape state 348. In the open state 320, the primary screen 104 and the secondary screen 108 are generally in the portrait-like orientation while in landscaped state 348 the primary screen 104 and the secondary screen 108 are generally in a landscape-like orientation.

State 324 is illustrative of a communication state, such as when an inbound or outbound call is being received or placed, respectively, by the exemplary communication device 100. While not illustrated for clarity, it should be appreciated the exemplary communication device 100 can transition to the inbound/outbound call state 324 from any state illustrated in FIG. 5A. In a similar manner, the image/video capture state 328 can be entered into from any other state in FIG. 5A, with the image/video capture state 328 allowing the exemplary communication device 100 to take one or more images via a camera and/or videos with a video capture device 240.

Transition state 322 illustratively shows primary screen 104 and the secondary screen 108 being closed upon one another for entry into, for example, the closed state 304.

FIG. 5B illustrates, with reference to the key, the inputs that are received to detect a transition from a first state to a second state. In FIG. 5B, various combinations of states are shown with in general, a portion of the columns being directed toward a portrait state 352, a landscape state 356, and a portion of the rows being directed to portrait state 360 and landscape state 364.

In FIG. 5B, the Key indicates that "H" represents an input from one or more Hall Effect sensors, "A" represents an input from one or more accelerometers, "T" represents an input from a timer, "P" represents a communications trigger input and "I" represents an image and/or video capture request input. Thus, in the center portion 376 of the chart, an input, or combination of inputs, are shown that represent how the exemplary communication device 100 detects a transition from a first physical state to a second physical state.

As discussed, in the center portion of the chart 376, the inputs that are received enable the detection of a transition from, for example, a portrait open state to a landscape easel state—shown in bold—"HAT." For this exemplary transition from the portrait open to the landscape easel state, a Hall Effect sensor ("H"), an accelerometer ("A") and a timer ("T") input may be needed. The timer input can be derived from, for example, a clock associated with the processor.

In addition to the portrait and landscape states, a docked state 368 is also shown that is triggered based on the receipt of a docking signal 372. As discussed above and in relation to FIG. 3, the docking signal can be triggered by the association of the exemplary communication device 100 with one or more other exemplary communication device 100s, accessories, peripherals, smart docks, or the like.

User Interaction:

The user can provide input via one or more mechanisms, including gestures and keypad input. The functional result of receiving a gesture can vary depending on a number of factors, including a state of the exemplary communication device 100, display 110, 114, or screen 104, 108, a context associated with the gesture, or sensed location of the gesture. The state of the device commonly refers to one or more of a configuration of the exemplary communication device 100, a display orientation, and user and other inputs received by the exemplary communication device 100. Context commonly refers to one or more of the particular application(s) selected by the gesture and the portion(s) of the application currently executing, whether the application is a single- or multi-screen application, and whether the application is a multi-screen application displaying one or more windows in one or more screens or in one or more stacks. Sensed location of the gesture commonly refers to whether the sensed set(s) of gesture location coordinates are on a touch sensitive display 110, 114 or a gesture capture region 120, 124, whether the sensed set(s) of gesture location coordinates are associated with a common or different display or screen 104,108, and/or what portion of the gesture capture region contains the sensed set(s) of gesture location coordinates.

Firmware and Software:

The memory 208 may store and the processor 204 may execute one or more software components. These components can include at least one operating system (OS) 516, an application manager 562, a desktop 566, and/or one or more applications 564a and/or 564b from an application store 560. The OS 516 can include a framework 520, one or more frame buffers 548, one or more drivers 512a-c, previously described in conjunction with FIG. 2, and/or a kernel 518. The OS 516 can be any software, consisting of programs and data, which manages computer hardware resources and provides common services for the execution of various applications 564. The OS 516 can be any operating system and, at least in some embodiments, dedicated to mobile devices, including, but not limited to, Linux, ANDROID™, iPhone OS (IOS™), WINDOWS PHONE 7 ™, etc. The OS 516 is operable to provide functionality to the phone by executing one or more operations, as described herein.

The applications 564 can be any higher level software that executes particular functionality for the user. Applications 564 can include programs such as email clients, web browsers, texting applications, games, media players, office suites, etc. The applications 564 can be stored in an application store 560, which may represent any memory or data storage, and the management software associated therewith, for storing the applications 564. Once executed, the applications 564 may be run in a different area of memory 508.

The framework 520 may be any software or data that allows the multiple tasks running on the device to interact. In embodiments, at least portions of the framework 520 and the discrete components described hereinafter may be considered part of the OS 516 or an application 564. However, these portions will be described as part of the framework 520, but those components are not so limited. The framework 520 can include, but is not limited to, a Multi-Display Management (MDM) module 524, a Surface Cache module 528, a Window Management module 532, an Input Management module 536, a Task Management module 540, an Application Model Manager 542, a Display Controller, one or more frame buffers

548, a task stack 552, one or more window stacks 550 (which is a logical arrangement of windows and/or desktops in a display area), and/or an event buffer 556.

The MDM module 524 includes one or more modules that are operable to manage the display of applications or other data on the screens of the device. An embodiment of the MDM module 524 is described in conjunction with FIG. 5B. In embodiments, the MDM module 524 receives inputs from the other OS 516 components, such as, the drivers 512, and from the applications 564 to determine continually the state of the exemplary communication device 100. The inputs assist the MDM module 524 in determining how to configure and allocate the displays according to the application's preferences and requirements, and the user's actions. Once a determination for display configurations is made, the MDM module 524 can bind the applications 564 to a display. The configuration may then be provided to one or more other components to generate a window with a display.

The Surface Cache module 528 includes any memory or storage and the software associated therewith to store or cache one or more images of windows. A series of active and/or non-active windows (or other display objects, such as, a desktop display) can be associated with each display. An active window (or other display object) is currently displayed. A non-active windows (or other display objects) were opened and, at some time, displayed but are now not displayed. To enhance the user experience, before a window transitions from an active state to an inactive state, a "screen shot" of a last generated image of the window (or other display object) can be stored. The Surface Cache module 528 may be operable to store a bitmap of the last active image of a window (or other display object) not currently displayed. Thus, the Surface Cache module 528 stores the images of non-active windows (or other display objects) in a data store.

In embodiments, the Window Management module 532 is operable to manage the windows (or other display objects) that are active or not active on each of the displays. The Window Management module 532, based on information from the MDM module 524, the OS 516, or other components, determines when a window (or other display object) is visible or not active. The Window Management module 532 may then put a non-visible window (or other display object) in a "not active state" and, in conjunction with the Task Management module Task Management 540 suspends the application's operation. Further, the Window Management module 532 may assign, through collaborative interaction with the MDM module 524, a display identifier to the window (or other display object) or manage one or more other items of data associated with the window (or other display object). The Window Management module 532 may also provide the stored information to the application 564, the Task Management module 540, or other components interacting with or associated with the window (or other display object). The Window Management module 532 can also associate an input task with a window based on window focus and display coordinates within the motion space.

The Input Management module 536 is operable to manage events that occur with the device. An event is any input into the window environment, for example, a user interface interactions with a user. The Input Management module 536 receives the events and logically stores the events in an event buffer 556. Events can include such user interface interactions as a "down event," which occurs when a screen 104, 108 receives a touch signal from a user, a "move event," which occurs when the screen 104, 108 determines that a user's finger is moving across a screen(s), an "up event," which occurs when the screen 104, 108 determines that the user has stopped touching the screen 104, 108, etc. These events are received, stored, and forwarded to other modules by the Input Management module 536. The Input Management module 536 may also map screen inputs to a motion space which is the culmination of all physical and virtual display available on the device.

The motion space is a virtualized space that includes all touch sensitive displays 110, 114 "tiled" together to mimic the physical dimensions of the exemplary communication device 100. For example, when the exemplary communication device 100 is unfolded, the motion space size may be 960× 800, which may be the number of pixels in the combined display area for both touch sensitive displays 110, 114. If a user touches on a first touch sensitive display 110 on location (40, 40), a full screen window can receive touch event with location (40, 40). If a user touches on a second touch sensitive display 114, with location (40, 40), the full screen window can receive touch event with location (520, 40), because the second touch sensitive display 114 is on the right side of the first touch sensitive display 110, so the exemplary communication device 100 can offset the touch by the first touch sensitive display's 110 width, which is 480 pixels. When a hardware event occurs with location info from a driver 512, the framework 520 can up-scale the physical location to the motion space because the location of the event may be different based on the device orientation and state. The motion space may be as described in U.S. patent application Ser. No. 13/187,026, filed Jul. 20, 2011, entitled "Systems and Methods for Receiving Gesture Inputs Spanning Multiple Input Devices," which is hereby incorporated by reference in its entirety for all that it teaches and for all purposes.

A task can be an application and a sub-task can be an application component that provides a window with which users can interact to do something, such as dial the phone, take a photo, send an email, or view a map. Each task may be given a window in which to draw a user interface. The window typically fills a display (for example, touch sensitive display 110, 114), but may be smaller than the display 110, 114 and float on top of other windows. An application usually consists of multiple sub-tasks that are loosely bound to each other. Typically, one task in an application is specified as the "main" task, which is presented to the user when launching the application for the first time. Each task can then start another task or sub-task to perform different actions.

The Task Management module 540 is operable to manage the operation of one or more applications 564 that may be executed by the device. Thus, the Task Management module 540 can receive signals to launch, suspend, terminate, etc. an application or application sub-tasks stored in the application store 560. The Task Management module 540 may then instantiate one or more tasks or sub-tasks of the application 564 to begin operation of the application 564. Further, the Task Management Module 540 may launch, suspend, or terminate a task or sub-task as a result of user input or as a result of a signal from a collaborating framework 520 component. The Task Management Module 540 is responsible for managing the lifecycle of applications (tasks and sub-task) from when the application is launched to when the application is terminated.

The processing of the Task Management Module 540 is facilitated by a task stack 552, which is a logical structure associated with the Task Management Module 540. The task stack 552 maintains the state of all tasks and sub-tasks on the exemplary communication device 100. When some component of the operating system 516 requires a task or sub-task to transition in its lifecycle, the OS 516 component can notify the Task Management Module 540. The Task Management Module 540 may then locate the task or sub-task, using identification information, in the task stack 552, and send a signal to the task or sub-task indicating what kind of lifecycle transition the task needs to execute. Informing the task or sub-task of the transition allows the task or sub-task to prepare for the lifecycle state transition. The Task Management Module 540 can then execute the state transition for the task or sub-task. In embodiments, the state transition may entail triggering the OS kernel 518 to terminate the task when termination is required.

Further, the Task Management module 540 may suspend the application 564 based on information from the Window Management Module 532. Suspending the application 564 may maintain application data in memory but may limit or stop the application 564 from rendering a window or user interface. Once the application becomes active again, the Task Management module 540 can again trigger the application to render its user interface. In embodiments, if a task is suspended, the task may save the task's state in case the task is terminated. In the suspended state, the application task may not receive input because the application window is not visible to the user.

The frame buffer 548 is a logical structure(s) used to render the user interface. The frame buffer 548 can be created and destroyed by the OS kernel 518. However, the Display Controller 544 can write the image data, for the visible windows, into the frame buffer 548. A frame buffer 548 can be associated with one screen or multiple screens. The association of a frame buffer 548 with a screen can be controlled dynamically by interaction with the OS kernel 518. A composite display may be created by associating multiple screens with a single frame buffer 548. Graphical data used to render an application's window user interface may then be written to the single frame buffer 548, for the composite display, which is output to the multiple screens 104,108. The Display Controller 544 can direct an application's user interface to a portion of the frame buffer 548 that is mapped to a particular display 110,114, thus, displaying the user interface on only one screen 104 or 108. The Display Controller 544 can extend the control over user interfaces to multiple applications, controlling the user interfaces for as many displays as are associated with a frame buffer 548 or a portion thereof. This approach compensates for the multiple physical screens 104,108 that are in use by the software component above the Display Controller 544.

The Application Manager 562 is an application that provides a presentation layer for the window environment. Thus, the Application Manager 562 provides the graphical model for rendering by the Task Management Module 540. Likewise, the Desktop 566 provides the presentation layer for the Application Store 560. Thus, the desktop provides a graphical model of a surface having selectable application icons for the Applications 564 in the Application Store 560 that can be provided to the Window Management Module 556 for rendering.

Further, the framework can include an Application Model Manager (AMM) 542. The Application Manager 562 may interface with the AMM 542. In embodiments, the AMM 542 receives state change information from the exemplary communication device 100 regarding the state of applications (which are running or suspended). The AMM 542 can associate bit map images from the Surface Cache Module 528 to the tasks that are alive (running or suspended). Further, the AMM 542 can convert the logical window stack maintained in the Task Manager Module 540 to a linear ("film strip" or "deck of cards") organization that the user perceives when the using the off gesture capture area 120 to sort through the windows. Further, the AMM 542 may provide a list of executing applications to the Application Manager 562.

Figure 3A:
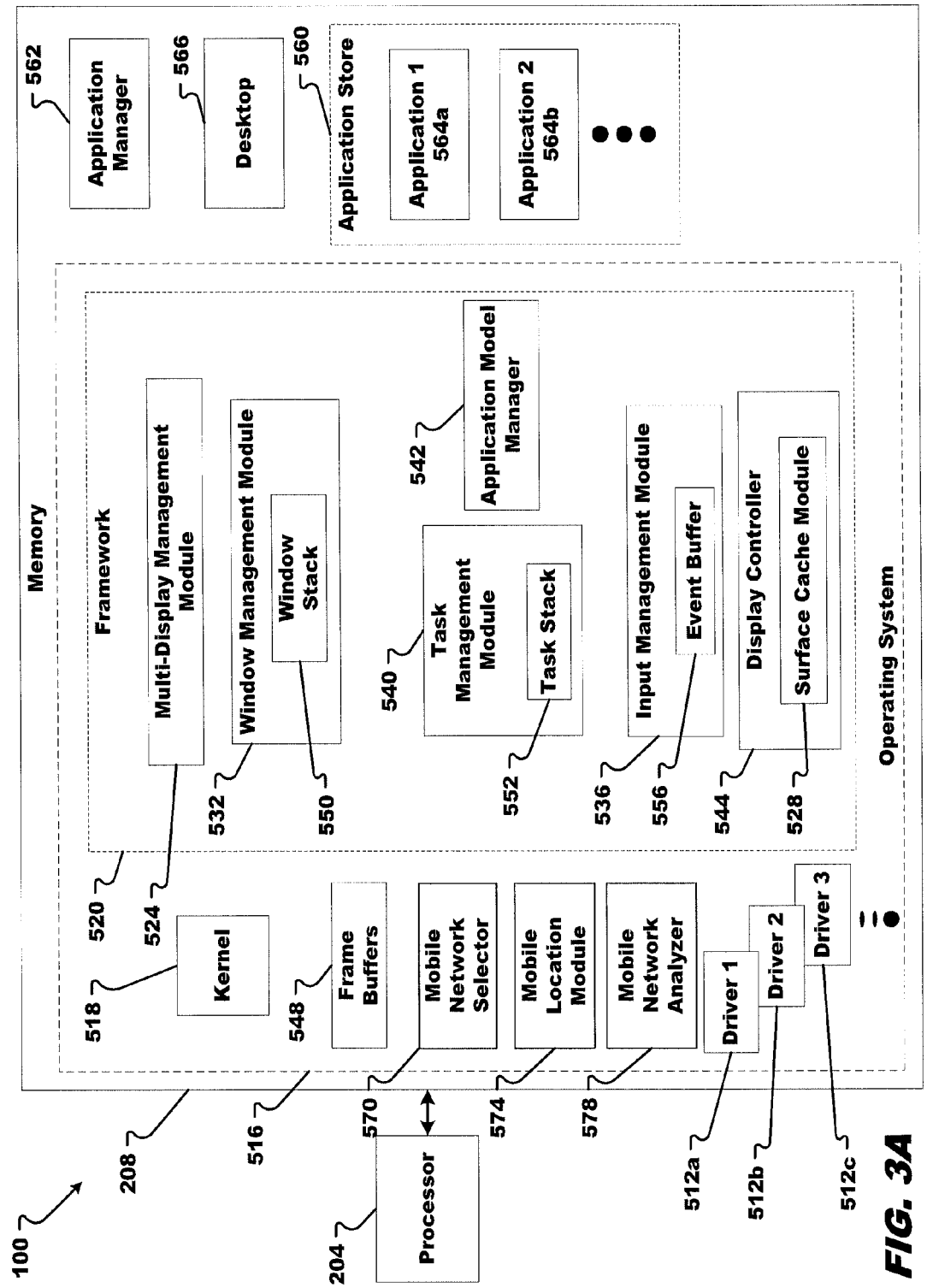
FIG. 3A is a block diagram of an embodiment of the state model for the device based on the device's orientation and/or configuration.
Figure 3B:
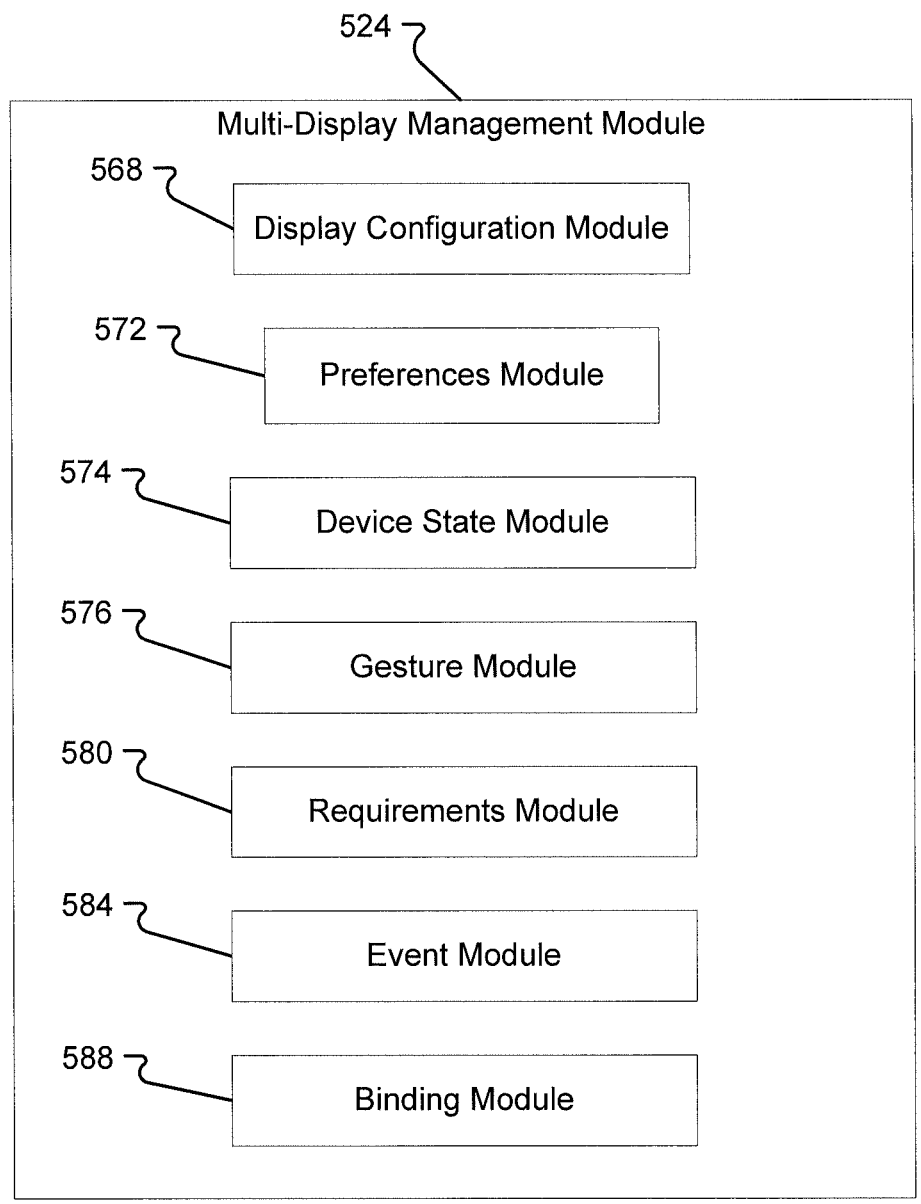
FIG. 3B is a block diagram of the functional components of the multi-display management module according to an embodiment.

An embodiment of the MDM module 524 is shown in FIG. 3B. The MDM module 524 is operable to determine the state of the environment for the device, including, but not limited to, the orientation of the device, whether the exemplary communication device 100 is opened or closed, what applications 564 are executing, how the applications 564 are to be displayed, what actions the user is conducting, the tasks being displayed, etc. To configure the display, the MDM module 524 interprets these environmental factors and determines a display configuration, as described in conjunction with FIGS. 4A-4J. Then, the MDM module 524 can bind the applications 564 or other device components to the displays. The configuration may then be sent to the Display Controller 544 and/or the other components within the OS 516 to generate the display. The MDM module 524 can include one or more of, but is not limited to, a Display Configuration Module 568, a Preferences Module 572, a Device State Module 574, a Gesture Module 576, a Requirements Module 580, an Event Module 584, and/or a Binding Module 588.

The Display Configuration Module 568 determines the layout for the display. In embodiments, the Display Configuration Module 568 can determine the environmental factors. The environmental factors may be received from one or more other MDM modules 524 or from other sources. The Display Configuration Module 568 can then determine from the list of factors the best configuration for the display. Some embodiments of the possible configurations and the factors associated therewith are described in conjunction with FIGS. 4A-4F.

The Preferences Module 572 is operable to determine display preferences for an application 564 or other component. For example, an application can have a preference for Single or Dual displays. The Preferences Module 572 can determine an application's display preference (e.g., by inspecting the application's preference settings) and may allow the application 564 to change to a mode (e.g., single screen, dual screen, max, etc.) if the exemplary communication device 100 is in a state that can accommodate the preferred mode. However, some user interface policies may disallow a mode even if the mode is available. As the configuration of the device changes, the preferences may be reviewed to determine if a better display configuration can be achieved for an application 564.

The Device State Module 574 is operable to determine or receive the state of the device. The state of the device can be as described in conjunction with FIGS. 5A and 5B. The state of the device can be used by the Display Configuration Module 568 to determine the configuration for the display. As such, the Device State Module 574 may receive inputs and interpret the state of the device. The state information is then provided to the Display Configuration Module 568.

The Gesture Module 576 is shown as part of the MDM module 524, but, in embodiments, the Gesture module 576 may be a separate Framework 520 component that is separate from the MDM module 524. In embodiments, the Gesture Module 576 is operable to determine if the user is conducting any actions on any part of the user interface. In alternative embodiments, the Gesture Module 576 receives user interface actions from the configurable area 112,116 only. The Gesture Module 576 can receive touch events that occur on the configurable area 112,116 (or possibly other user interface areas) by way of the Input Management Module 536 and may interpret the touch events (using direction, speed, distance, duration, and various other parameters) to determine what kind of gesture the user is performing. When a gesture is interpreted, the Gesture Module 576 can initiate the processing of the gesture and, by collaborating with other Framework 520 components, can manage the required window animation. The Gesture Module 576 collaborates with the Application Model Manager 542 to collect state information with respect to which applications are running (active or paused) and the order in which applications must appear when a user gesture is performed. The Gesture Module 576 may also receive references to bitmaps (from the Surface Cache Module 528) and live windows so that when a gesture occurs it can instruct the Display Controller 544 how to move the window(s) across the display 110,114. Thus, suspended applications may appear to be running when those windows are moved across the display 110,114.

Further, the Gesture Module 576 can receive task information either from the Task Manage Module 540 or the Input Management module 536. The gestures may be as defined in conjunction with FIGS. 4A through 4J. For example, moving a window causes the display to render a series of display frames that illustrate the window moving. The gesture associated with such user interface interaction can be received and interpreted by the Gesture Module 576. The information about the user gesture is then sent to the Task Management Module 540 to modify the display binding of the task.

The Requirements Module 580, similar to the Preferences Module 572, is operable to determine display requirements for an application 564 or other component. An application can have a set display requirement that must be observed. Some applications require a particular display orientation. For example, the application "Angry Birds" can only be displayed in landscape orientation. This type of display requirement can be determined or received, by the Requirements Module 580. As the orientation of the device changes, the Requirements Module 580 can reassert the display requirements for the application 564. The Display Configuration Module 568 can generate a display configuration that is in accordance with the application display requirements, as provided by the Requirements Module 580.

The Event Module 584, similar to the Gesture Module 576, is operable to determine one or more events occurring with an application or other component that can affect the user interface. Thus, the Event Module 584 can receive event information either from the event buffer 556 or the Task Management module 540. These events can change how the tasks are bound to the displays. The Event Module 584 can collect state change information from other Framework 520 components and act upon that state change information. In an example, when the phone is opened or closed or when an orientation change has occurred, a new message may be rendered in a secondary screen. The state change based on the event can be received and interpreted by the Event Module 584. The information about the events then may be sent to the Display Configuration Module 568 to modify the configuration of the display.

The Binding Module 588 is operable to bind the applications 564 or the other components to the configuration determined by the Display Configuration Module 568. A binding associates, in memory, the display configuration for each application with the display and mode of the application. Thus, the Binding Module 588 can associate an application with a display configuration for the application (e.g. landscape, portrait, multi-screen, etc.). Then, the Binding Module 588 may assign a display identifier to the display. The display identifier associated the application with a particular display of the exemplary communication device 100. This binding is then stored and provided to the Display Controller 544, the other components of the OS 516, or other components to properly render the display. The binding is dynamic and can change or be updated based on configuration changes associated with events, gestures, state changes, application preferences or requirements, etc.

Returning to FIG. 3A, the mobile network selector 574 selects, from among plural available, compatible wireless networks 1104*a-c*, a wireless network to be used for a selected task, sub-task, or other transaction between the communication device 100 and a destination or source node 1100 involving an exchange of data. The selection can be based on a myriad of factors other than or in addition to network speed (which can be indicated by maximum path speed, relative path speed, idle latency (packet round trip time), and delay), including without limitation current or anticipated or guaranteed user requirements, required bit rate, network reliability (which can be indicated by jitter or packet loss, packet dropping probability, out-of-order delivery, and/or bit error rate), network performance, network bandwidth, throughput, and data transmission cost (which can be indicated by CPU usage, compressed or uncompressed data size or quantity to be communicated over the wireless network, user network access terms and conditions with the network operator, CPU usage, and whether or not encryption is to be employed, number of hops from communication device to destination or source node, and type of data to be communicated).

In one configuration, the mobile network selector 574, based on network state information provided by the network analyzer 578 and other factors, selects, applying a predetermined set of rules, a suitable wireless network for a transaction. The selection may be made before or during execution of the transaction or communication of the data involved with the transaction.

The selection may be prompted in response to a user establishing a network connection, initiating an application or service (e.g., a voice and/or video communication, executing an application that requires duplexed or two-way communication through a network), a transaction (such as uploading or downloading (multi-)media content, user or destination or source node generated or originated information, software, or other data), or network consumptive activity (e.g., an activity which requires the use of a network resources over a certain period of time above a user specified network determined or machine coded threshold). Alternatively or additionally, the selection may be in response to a general rule that all applications and services are expected to follow the same protocol unless more information is provided by the user to select a particular optimization criteria for a specified activity or transaction.

In one application, the mobile network selector 574, compares the network state information for each compatible, currently accessible wireless network with data transmission resource requirements for the transaction and/or the application or service executing the transaction and/or as determined by user preferences and, based on predetermined rules, determines if a compatible, currently accessible network is sufficient to perform the activity in compliance with the requirements and which of the other compatible, currently accessible networks can satisfy one or more of the requirements. The requirements may be ranked hierarchically in order of importance, such that if the highest ranked requirement is satisfied by a compatible network but the second highest ranked requirement is not, the network may nonetheless be eligible for consideration by the user. As noted, the requirements typically involve one or more of data transmission speed required for adequate performance, network reliability required for adequate performance (e.g., video link, audio link, etc.), total network resources consumed or to be consumed by the transaction and/or the application or service executing the transaction, network performance, and network data usage cost per unit. Based on the results and predetermined rules, the mobile network selector 574 selects a suitable wireless network from among the plurality of networks. A suitable network typically is one that can perform the activity with acceptable performance characteristics and/or under a certain cost budget and/or in compliance with one or more of the requirements.

The results can be an expected likelihood or probability or instance of one or more requirements being satisfied by a network within a determinate or indeterminate period of time, a side-by-side comparison of the current and/or expected performance of the current or possible network with the requirements with a cumulative compliance or non-compliance score being determined and assigned to each of the plural networks, an expected performance of the current and each compatible network within a determinate or indeterminate period of time, the likelihood or probability of performing and completing the transaction successfully within a determinate or indeterminate period of time, the expected cost of the performance and/or completion of the activity within a determinate or indeterminate period of time, the expected cost per unit time of the performance and/or completion of the transaction (where the transaction is indeterminate in length such as streaming audio and/or video, making a voice call, an e-commerce interaction, etc.), and the like.

The rules could be default and/or configured by the user. The rules could be threshold-based, with a score, rank, or likelihood or probability in excess of a selected threshold making the respective network eligible for selection. The rules could use a composite scoring algorithm, with one or more requirements being given a higher weighting than other requirement(s). For example, one or more of data transmission speed, network reliability, and network data usage cost per unit than another of data transmission speed, network reliability, and network data usage cost per unit. When cost alone is prioritized, the network selected is that network which minimizes substantially (or relative to the other plural networks) the cost to the user of the communication of the data. When speed alone is prioritized, the network selected is that network which maximizes substantially (or relative to the other plural networks) the real or expected rate of communication (e.g., transmission, upload and/or download) of the data. When reliability alone is prioritized, the network selected is that network that maximizes substantially (or relative to the other plural networks) the quality of the data transmitted through the network and/or minimizes substantially the probability that some quantity of data is lost during transmission. By way of illustration, the network is selected that is most capable of complying with requirements of data transmission speed and network reliability while remaining within a certain cost budget or ceiling. The rules could be a cumulative rank based on simple compliance with each of the requirements, with the networks being ranked in order of compliance with the most to the least number of requirements.

In one configuration, the mobile network selector 574 presents the user with the results of the comparison and gives the user the option of continuing with the current wireless network or selecting a new (compatible) wireless network that more optimally satisfies one or more of the requirements. A graphical or textual user interface can be provided to the user, which allows the user to choose to optimize or improve a network selection for a transaction. A graphical or textual cue as to which prioritized factors the user has selected from among the factors of data transmission speed, cost and reliability the user has selected can be displayed on the primary or secondary screen or display. This information may be displayed in conjunction with performance metrics, such as data transmission speed (e.g., actual, maximum, expected, average, median, mode, minimum, etc.) of the network and/or the data transmission cost (e.g., actual, maximum, expected, average, median, mode, minimum, etc.) of the network. In one configuration, a toolbar at the top of the screen or display presents this information side-by-side.

Figure 6:
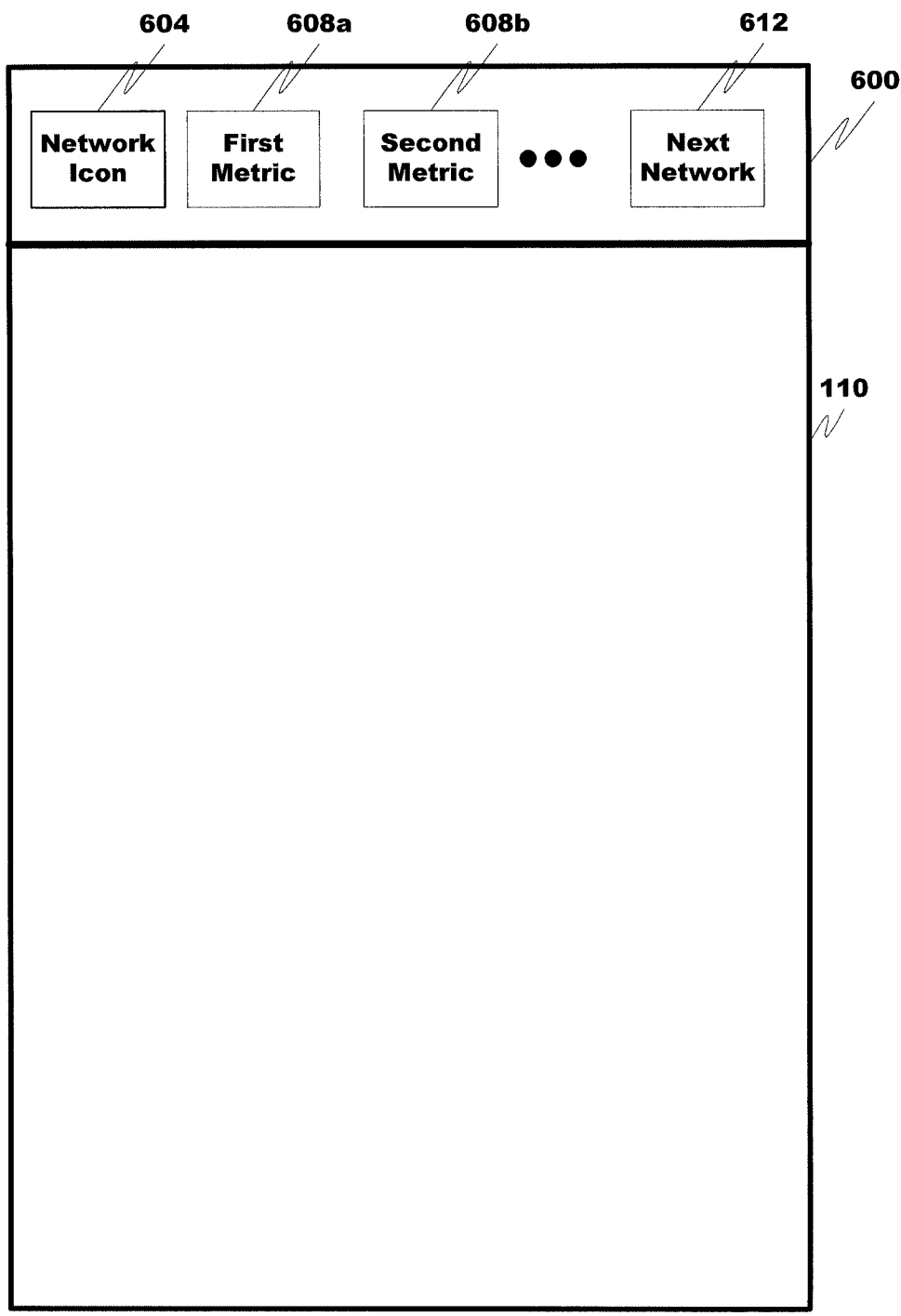
FIG. 6 depicts a display according to an embodiment.

With reference to FIG. 6, the touch sensitive display 110 of the primary screen 104 is depicted. Along an upper toolbar 600 are a plurality of icons or other display objects. The display objects include a network icon 604 identifying, typically uniquely, a corresponding compatible wireless network for the associated communication device 100, and a plurality of first, second, . . . metrics 608$a,b$, . . . , providing network state information for the corresponding compatible wireless network. The network state information can include, for example, data transmission speed (e.g., actual, maximum, expected, average, median, mode, minimum, etc.) of the network, the data transmission cost (e.g., actual, maximum, expected, average, median, mode, minimum, etc.) of the network, or the reliability of the network. The metric may also be a comparative metric that compares a network parameter of the compatible wireless network against a corresponding requirement and/or that of another selected compatible wireless network, such as a currently selected wireless network. The "next network" icon 612 enables the user to toggle or move from compatible wireless network-to-compatible wireless network. As will be appreciated, the tool bar 600 may be located in another portion of the display 110, such as at a side and/or bottom and/or a centrally located display portion. Once a displayed network icon 604 is displayed that has satisfactory properties, the user can select the network as the current network by a suitable gesture, keypad selection, or other input.

In one configuration, the mobile network selector 570 provides the user with the option of selecting one or more network characteristics to be used in selecting a compatible and currently accessible network. The one or more network characteristics include any of the characteristics discussed herein.

In one configuration, the mobile network selector 570 uses a current spatial location of the communication device 100 as a factor presented to the user to facilitate network selection by the user or in itself selecting automatically a suitable wireless network. The location information can be compared against a prioritization list, or look up table, which ranks each member of a set of wireless communication protocols and/or networks on the basis of each member's known and/or expected efficiency at the selected location. In one application, radio communications from the communication device 100 are first routed through the priority network selected based on the current location and look up table. As the user performs network-related activities, such as performing a transaction and/or executing a selected application or service executing the transaction and user requirements change, a second network can be selected using one of the algorithms discussed above.

In one configuration, the mobile network selector 570 selects a network, which, based on network metric information received from the mobile network analyzer 578, has the highest throughput speed (weighted for integrity/loss) as a primary communication path for the device 100. When the user initiates, by the communication device 100, an activity which demands data throughput via a network, the primary communication path is used. An icon or other graphical notification is given on the primary display 110 of the communication device 100. The icon or other graphical notification shows the nature or type or performance characteristics of the primary communication path. As discussed elsewhere, the primary communication path may be changed at any time based upon a change in one or more of communication device 100 location, a requirement of a selected transaction and/or application or service executing the transaction, a user requirement or preference, or a performance network characteristic of the primary communication path and/or in an alternate communication path for another wireless network (in response to network activity of third parties (e.g., network congestion level), resource consumption level by other users, resource malfunction, or other factor or condition altering such a performance characteristic). In one application, the mobile network selector periodically or continually compares the performance characteristics of multiple communication paths to select an optimal communication path for use as the primary communication path.

The mobile location module 574 determines a current spatial location of the communication device 100. This can be done by any suitable algorithm or combination of algorithms. One algorithm is by SPS location coordinates, e.g., latitude, longitude, and/or altitude. Another algorithm is by cell tower triangulation. As will be appreciated, triangulation is the process of determining the location of a point by measuring angles to it from known points at either end of a fixed baseline, rather than measuring distances to the point directly (trilateration). The point can then be fixed as the third point of a triangle with one known side and two known angles. Another algorithm is multilateration (where a point is calculated using the time-difference-of-arrival between other known points). Location by this technique occurs via multilateration of radio signals between (several) radio towers of the network and the communication device. Another algorithm is trilateration (where a point is calculated given its distances from other known points). Another algorithm is WiFi™ positioning (where a fact of WiFi™ access by the communication device 100 coupled with a range of WiFi™ access from an access point (the location of which is known) provides location information for the communication device 100. Another algorithm is Bluetooth™ positioning (where a fact of Bluetooth™ access by the communication device 100 coupled with a range of Bluetooth™ access from an access point (the location of which is known) provides location information for the communication device 100.

The mobile network analyzer 578 can analyze a performance of a wireless network by many techniques. In one example, the communication device 100 periodically sends a packet through each of the available networks. Each of the networks is timed for data packet throughput speed and data packet integrity (loss). In another method, a "large" file is transferred from one system to another system and the time required to complete the transfer or copy of the file measured. The throughput is then calculated by dividing the file size by the time to get the throughput in megabits, kilobits, or bits per second. The results of such an exercise can result in the goodput, which is typically less than the maximum theoretical data throughput, leading the user to believe that his or her communications link is not operating correctly. In fact, there are many overheads accounted for in goodput in addition to transmission overheads, including latency, TCP Receive Window size and system limitations, which means the calculated goodput does not reflect the maximum achievable throughput. Performance can be measured using packet pinging, such as done by HTTPing. Performance can be measured using active and/or passive techniques. Active techniques (e.g. Iperf) are more intrusive but are arguably more accurate. Passive techniques (e.g. Pasinemda) are of less network overhead and hence can run in the background to be used to trigger network management actions. Some tools measure traffic by sniffing and others use SNMP, WMI or other local agents to measure bandwidth use on individual machines and routers. However, the latter generally do not detect the type of traffic, nor do they work for machines which are not running the necessary agent software, such as rogue machines on the network, or machines for which no compatible agent is available. In the latter case, inline appliances are preferred. These would generally 'sit' between the LAN and the LAN's exit point, generally the WAN or Internet router, and all packets leaving and entering the network would go through them. In most cases the appliance would operate as a bridge on the network so that it is undetectable by users. Performance can also be modeled instead of measured; one example of this is using state transition diagrams to model queuing performance in a circuit-switched network. These diagrams allow the network planner to analyze how the network will perform in each state, ensuring that the network will be optimally designed. In other applications, the mobile network analyzer 578 accesses information from local or remote storage regarding bandwidth consumption, bandwidth availability, network usage levels, current user admission control restrictions, usage scheduling restrictions, flow control restrictions, and the like. Remote storage could, for example, be at an intermediate node, such as a gateway, router, server, firewall, wireless access point, base station, and/or other device.

The order in which wireless networks are tested or analyzed can be determined by many techniques. For example, the order may be determined using a current logical, virtual, or spatial location as determined by the mobile location module 574. The order may be determined based on historical relative performances of the various mobile networks. The order may be determined based on the type and/or requirements of the transaction, application, or service to be executed or performed by the user. The order may be determined based on the type of data to be communicated by the communication device 100. The order may be determined based on the type of communication device. The order may be determined based on data communication cost limitations set by the user. Other techniques for determining the order can also or alternatively be used.

Figure 7:
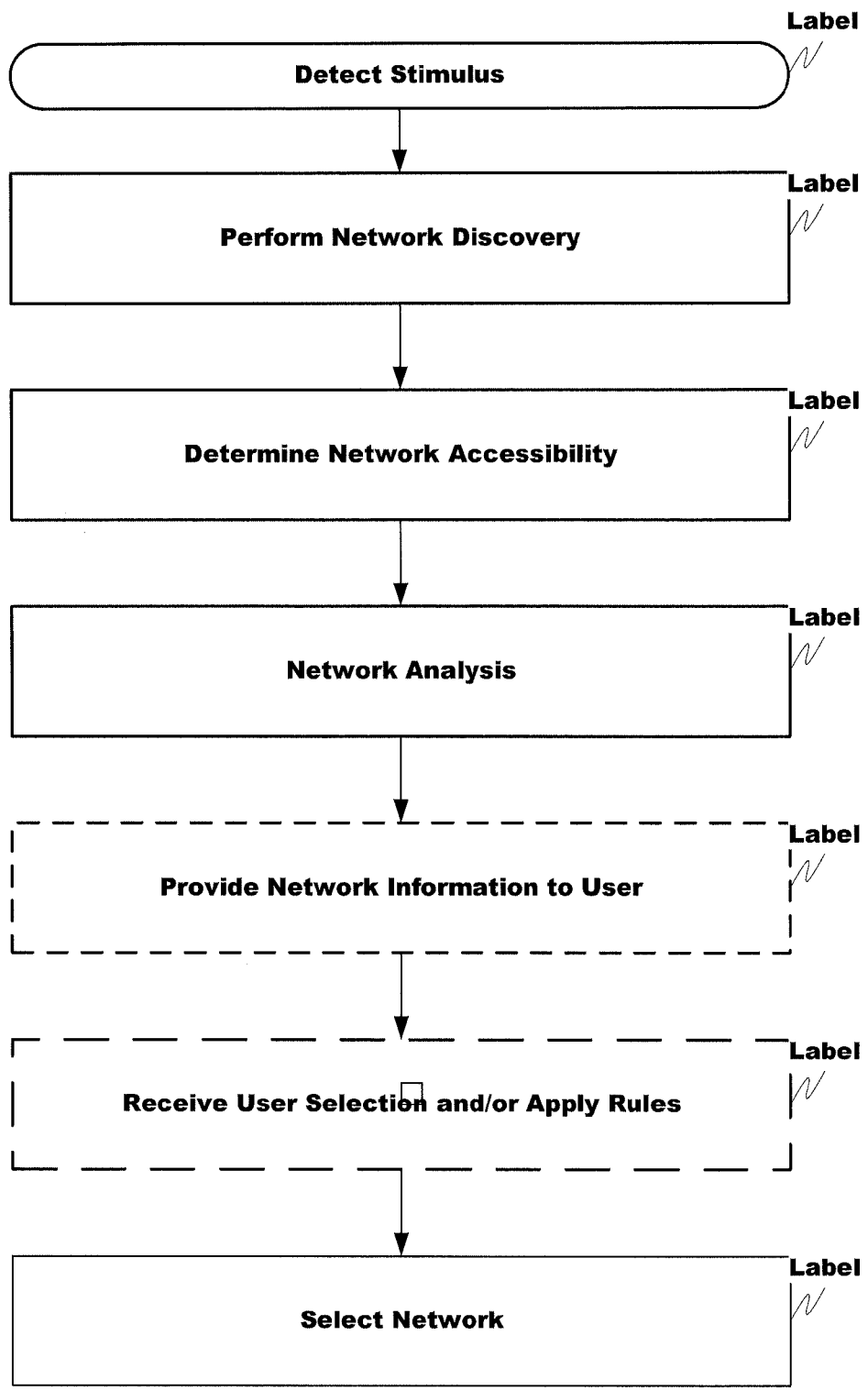
FIG. 7 depicts a flow chart according to an embodiment.

Methods of Operation:

With reference to FIG. 7, the mobile network selector 570, in step 700, detects a stimulus for network selection. The stimulus can be, for example, in response to a user request or other input, a user establishing a network connection, initiating an application or service or other transaction, a general rule that all applications and services follow the same protocol unless more information is provided by the user to select a particular optimization criteria for a specified activity or transaction, detecting a (new) network accessibility, a deficient level of performance (determined by one or more selected factors of network speed (which can be indicated by maximum path speed, relative path speed, idle latency (packet round trip time), and delay), including without limitation current or anticipated or guaranteed user requirements, required bit rate, network reliability (which can be indicated by jitter or packet loss, packet dropping probability, out-of-order delivery, and/or bit error rate), network performance, network bandwidth, throughput, and data transmission cost (which can be indicated by CPU usage, compressed or uncompressed data size or quantity to be communicated over the wireless network, user network access terms and conditions with the network operator, CPU usage, and whether or not encryption is to be employed, number of hops from communication device to destination or source node, and type of data to be communicated), exceeding or falling below (as appropriate) one or more suitable thresholds), and a change in logical, virtual, or spatial location of the user's communication device.

In step 704, the mobile network selector 570 requests the mobile network analyzer 578 to collect and provide to mobile network selector 570 network analysis information for each compatible, detected network. In response, the mobile network selector 570 performs network discovery by known techniques to determine which networks are currently accessible by the communication device 100.

In step 712, the mobile network analyzer 578, analyzes each network and collects and determines network information, network-by-network, using one or more of the techniques described above. The network information is typically stored locally with a suitable timestamp and unique identifier for the corresponding network. The collected network information, with the unique identifier for the corresponding network, is provided by the mobile network analyzer 578 to the mobile network selector 570.

In optional steps 716 and 720, respectively, the network information for each network is provided to the user as discussed above and a user network selection is received from the user. Alternatively, the mobile network selector 570, applying appropriate predetermined rules, provides a recommended subset of networks to the user in optional step 716.

In step 724, the mobile network selector 570 selects, based on user input, a compatible, currently accessible network from among the plurality of compatible, currently accessible networks.

Alternatively, in step 724, the mobile network selector 570, based on network information and applying appropriate predetermined rules, selects, without user input, a network from among the plurality of compatible, accessible networks.

When the selected network differs from a currently accessed network, the mobile network selector 570 then instructs the cellular telephony module 228 or other wireless communication module 232 to terminate use of a currently accessed network and initiate use of the selected network.

Figure 8:
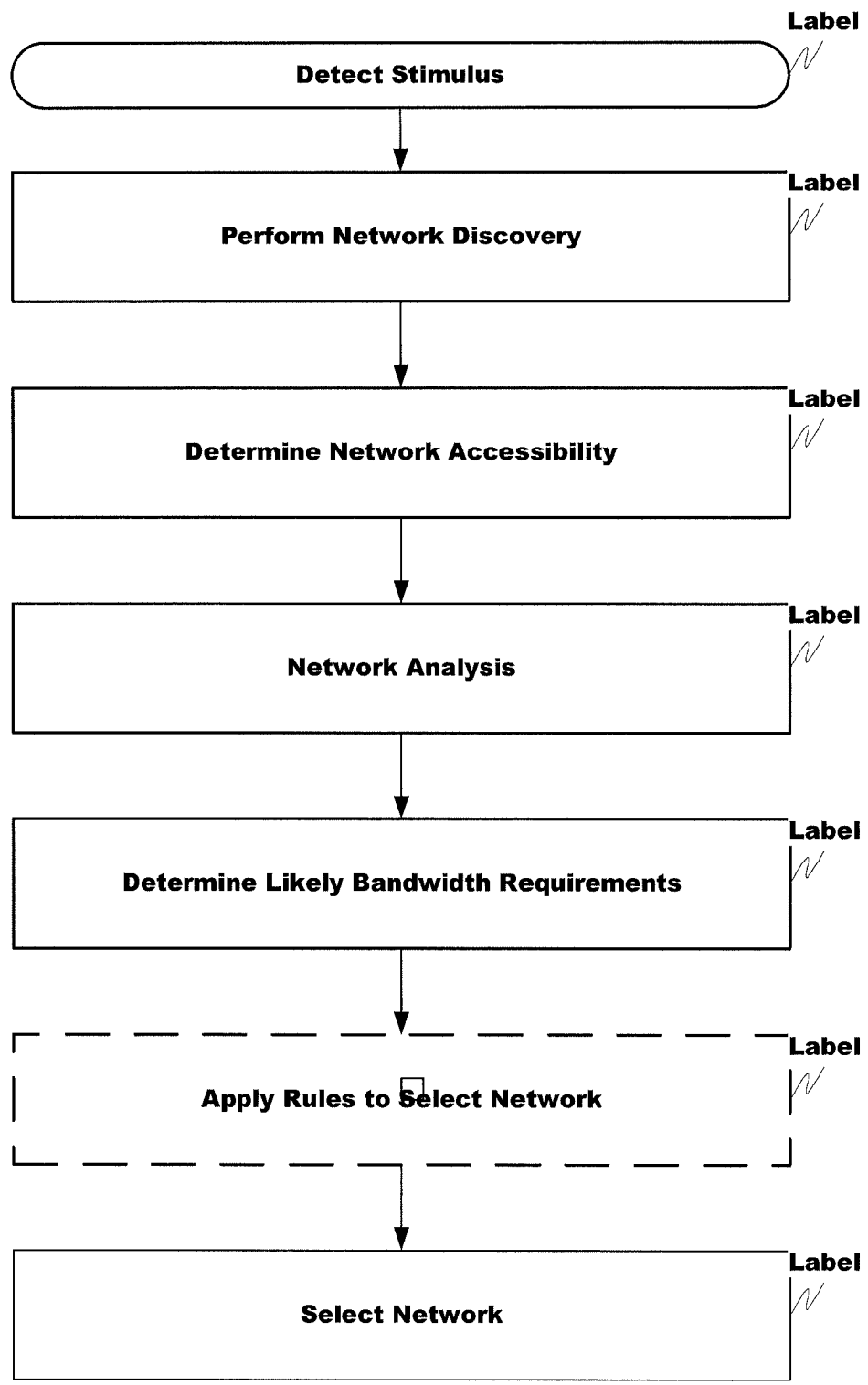
FIG. 8 depicts a flow chart according to an embodiment.

FIG. 8 differs from FIG. 7 in a number of aspects. In step 816, the mobile network analyzer 578, in step 712, determines currently available bandwidth and/or throughput, network-by-network, and, in step 816, likely bandwidth requirements for a currently user initiated application or other transaction. In optional step 820, the mobile network selector 570, comparing the currently available bandwidth and/or throughput, network-by-network, against likely bandwidth and/or throughput requirements selects a best, optimal, or preferred network from among the plural compatible, currently accessible networks. Alternatively, the mobile network selector 570 determines a recommended subset of compatible, currently accessible networks and provides, as discussed previously, the subset of networks to the user for network selection. Alternatively, the set of compatible, currently accessible networks and corresponding network information (e.g., currently available bandwidth and/or throughput) is provided to the user for network selection.

In other embodiments, one or more other factors, in lieu of or in addition to bandwidth and/or throughput requirement(s), is/are used in network selection. Such requirement(s) include one or more of data transmission speed required for adequate performance, network reliability required for adequate performance (e.g., video link, audio link, etc.), total network resources consumed or to be consumed by the transaction and/or the application or service executing the transaction, network performance, and network data usage cost per unit.

In other embodiments, one or more other factors, in lieu of or addition to bandwidth and/or throughput, is/are used in network selection. Such factors include one or more of network speed, including without limitation current or anticipated or guaranteed user requirements, required bit rate, network reliability, network performance, and data transmission cost.

In step 824, the mobile network selector 570, based on user input and/or comparison of the requirement(s) against the current network information and optionally application of a set of rules, selects a network.

Figure 9:
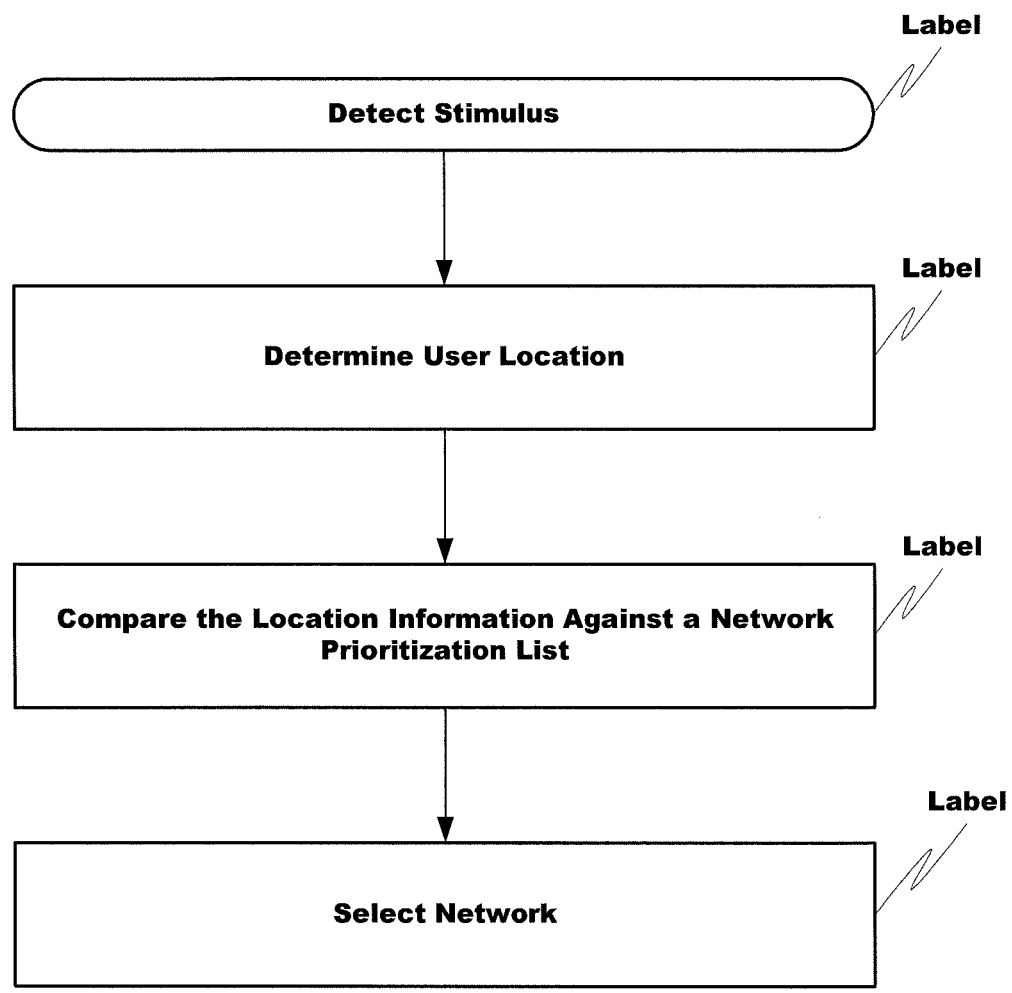
FIG. 9 depicts a flow chart according to an embodiment.

FIG. 9 also differs from FIG. 7 in a number of aspects. In step 904, the mobile location module 574 determines a current spatial location of the communication device 100. The mobile location module 574, in step 908, then compares the current location information against a network prioritization list and optionally determines whether the prioritization list has changed from a currently applicable prioritization list. When no change is detected, no network need be selected in step 912. When a change is detected, the mobile location module 574 notifies the mobile network selector 570 of the change in network preferences due to the change in communication device 100 location and provides the new prioritization list to the mobile network selector 570. In step 912, the mobile network selector 570 selects a new network when applicable.

In other embodiments, the stimulus is a request from the mobile network selector 570 for a currently applicable network prioritization list for use in network selection by the mobile network selector 570.

The exemplary systems and methods of this disclosure have been described in relation to an exemplary communication device and interaction with the device. However, to avoid unnecessarily obscuring the present disclosure, the preceding description omits a number of known structures and devices. This omission is not to be construed as a limitation of the scopes of the claims. Specific details are set forth to provide an understanding of the present disclosure. It should however be appreciated that the present disclosure may be practiced in a variety of ways beyond the specific detail set forth herein.

For example, the communication device could have multiple physical and/or logical screens/displays. Additionally, the communication device could be used with one or more input devices such as a stylus, mouse, or the like. Moreover, the communication device could be populated with a processor, memory, communications means and the like that would allow for stand-alone operation. Even further, the communication device could be associated or docked with other types of communications devices such as a smartphone such that the communication device could be used as a display and/or I/O interface therefore.

Furthermore, while the exemplary aspects, embodiments, and/or configurations illustrated herein show the various components of the system collocated, certain components of the system can be located remotely, at distant portions of a distributed network, such as a LAN and/or the Internet, or within a dedicated system. Thus, it should be appreciated, that the components of the system can be combined in to one or more devices, such as a tablet-like device, or collocated on a particular node of a distributed network, such as an analog and/or digital telecommunications network, a packet-switch network, or a circuit-switched network. It will be appreciated from the preceding description, and for reasons of computational efficiency, that the components of the system can be arranged at any location within a distributed network of components without affecting the operation of the system. For example, the various components can be located in a switch such as a PBX and media server, gateway, in one or more communications devices, at one or more users' premises, or some combination thereof. Similarly, one or more functional portions of the system could be distributed between a telecommunications device(s) and an associated computing device.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

Also, while the flowcharts have been discussed and illustrated in relation to a particular sequence of events, it should be appreciated that changes, additions, and omissions to this sequence can occur without materially affecting the operation of the disclosed embodiments, configuration, and aspects.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the disclosed embodiments, configurations and aspects includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as program embedded on personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various aspects, embodiments, and/or configurations, includes components, methods, processes, systems and/or apparatus substantially as depicted and described herein, including various aspects, embodiments, configurations embodiments, subcombinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A wireless communication device, comprising:
a display to provide graphical information to a user;
a cellular telephony module to access at least one cellular network;
a wireless communication module to access at least one non-cellular network;
an antenna configured to be in wireless communication with a plurality of compatible and currently accessible communication networks, the plurality of compatible and currently accessible communication networks comprising the at least one cellular network and at least one non-cellular network;
a power source and power control module operable to provide power to the device; and
a mobile network selector operable to perform one of the following sets of operations:
provide, by the display, to a user of the wireless communication device, for an identified compatible and currently accessible communication network, network information comprising one or more of network speed, network reliability, network performance, network bandwidth, network throughput, and data transmission cost and receive, from the user for wireless communications by the wireless communication device, a selected compatible and currently accessible communication network from among the plurality of compatible and currently accessible communication networks;
receive, from the user, a selection of at least one of a preferred network characteristic to be used in selecting, for wireless communications by the wireless communication device, a compatible and currently accessible communication network from among the plurality of compatible and currently accessible communication networks; and
provide, by the display, to the user, an indicator of which network characteristic was selected by the user to be used by the mobile network selector in selecting, for wireless communications by the wireless communication device, a compatible and currently accessible communication network from among the plurality of compatible and currently accessible communication networks; and
wherein the at least one non-cellular network is defined by one of the following protocols: Wimax, WiFi™, and Bluetooth™, wherein the at least one cellular network is defined by at least one of the following radio data communication protocols: HIPERMAN, iBurst, EDGE Evolution, EV-DO, Flash-OFDM, 1G, 2G, 2.5G, 2.75G, 3G, pre-4G, 4G, 5G, UMTS W-CDMA, and UMTS-TDD; and
wherein the mobile network selector compares network state information for each of the compatible, currently accessible wireless network with at least one data transmission resource requirement for an application, service, transaction, and/or user preference, based on predetermined rules and determines if one or more of the compatible, currently accessible networks can satisfy the at least one data transmission resource requirement, wherein the at least one data transmission resource requirement comprises multiple requirements ranked hierarchically in order of importance, such that, if a highest ranked requirement is satisfied, but a second highest ranked requirement is not satisfied, by a selected compatible and currently accessible network, the selected compatible and currently accessible network is eligible for selection and wherein the at least one data transmission requirement comprises one or more of data transmission speed required for adequate performance, network reliability required for adequate performance, total network resources consumed or to be consumed, network performance, and network data usage cost per unit.

2. The device of claim 1, wherein operation set (b) is performed, and wherein the network characteristic is one or more of network speed, network reliability, network performance, network bandwidth, network throughput, and data transmission cost.

3. The device of claim 1, wherein operation set (c) is performed and wherein the network characteristic is one or more of network speed, network reliability, network performance, network bandwidth, network throughput, and data transmission cost.

4. The device of claim 1, wherein the mobile network selector selects a compatible and currently accessible network during execution of an application, service, or transaction.

5. The device of claim 1, wherein the display provides simultaneously to the user and for an identified network, measured values for a plurality of network speed, network reliability, network performance, network bandwidth, network throughput, and data transmission cost.

6. A wireless communication device, comprising:
a display to provide graphical information to a user;
a cellular telephony module to access at least one cellular network;
a wireless communication module to access at least one non-cellular network;
an antenna configured to be in wireless communication with a plurality of compatible and currently accessible communication networks, the plurality of compatible and currently accessible communication networks comprising the at least one cellular network and at least one non-cellular network;
a power source and power control module operable to provide power to the device; and
a mobile network selector operable to perform one of the following sets of operations:
provide, by the display, to a user of the wireless communication device, for an identified compatible and currently accessible communication network, network information comprising one or more of network speed, network reliability, network performance, network bandwidth, network throughput, and data transmission cost and receive, from the user for wireless communications by the wireless communication device, a selected compatible and currently accessible communication network from among the plurality of compatible and currently accessible communication networks;
receive, from the user, a selection of at least one of a preferred network characteristics to be used in selecting, for wireless communications by the wireless communication device, a compatible and currently accessible communication network from among the plurality of compatible and currently accessible communication networks; and
provide, by the display, to the user, an indicator of which network characteristic was selected by the user to be used by the mobile network selector in selecting, for wireless communications by the wireless communication device, a compatible and currently accessible communication network from among the plurality of compatible and currently accessible communication networks; and wherein the at least one non-cellular network is defined by one of the following protocols: Wimax, WiFi™, and Bluetooth™, wherein the at least one cellular network is defined by at one of the following radio data communication protocols: HIPERMAN, iBurst, EDGE Evolution, EV-DO, Flash-OFDM, 1G, 2G, 2.5G, 2.75G, 3G, pre-4G, 4G, 5G, UMTS W-CDMA, and UMTS-TDD; and wherein the mobile network selector selects a compatible and currently accessible network in response to one or more of a user establishing a network connection and initiating an application or service, a transaction, or network consumptive action and wherein the mobile network selector at least one of: determines an expected likelihood of the at least one data transmission requirement being satisfied by a selected compatible and currently accessible network within a selected period of time; outputs a side-by-side comparison of a current and/or expected performance of each of the compatible and currently accessible networks with the at least one data transmission requirement; assigns a compliance or non-compliance score to each of the plurality of compatible and currently accessible networks; determines an expected performance of each of the plurality of compatible and currently accessible networks within the selected period of time; determines a probability of performing and completing a transaction successfully within the selected period of time; determines an expected cost of the performance and/or completion of the transaction within the selected period of time; and determines an expected cost per unit time of the performance and/or completion of the transaction.

7. A wireless communication device, comprising:

a display to provide graphical information to a user;

a cellular telephony module to access at least one cellular network;

a wireless communication module to access at least one non-cellular network;

an antenna configured to be in wireless communication with a plurality of compatible and currently accessible communication networks, the plurality of compatible and currently accessible communication networks comprising the at least one cellular network and at least one non-cellular network;

a power source and power control module operable to provide power to the device; and a mobile network selector operable to perform one of the following sets of operations:

provide, by the display, to a user of the wireless communication device, for an identified compatible and currently accessible communication network, network information comprising one or more of network speed, network reliability, network performance, network bandwidth, network throughput, and data transmission cost and receive, from the user for wireless communications by the wireless communication device, a selected compatible and currently accessible communication network from among the plurality of compatible and currently accessible communication networks;

receive, from the user, a selection of at least one of a preferred network characteristics to be used in selecting, for wireless communications by the wireless communication device, a compatible and currently accessible communication network from among the plurality of compatible and currently accessible communication networks; and provide, by the display, to the user, an indicator of which network characteristic was selected by the user to be used by the mobile network selector in selecting, for wireless communications by the wireless communication device, a compatible and currently accessible communication network from among the plurality of compatible and currently accessible communication networks; and wherein the at least one non-cellular network is defined by one of the following protocols: Wimax, WiFi™, and Bluetooth™, wherein the at least one cellular network is defined by at one of the following radio data communication protocols: HIPERMAN, iBurst, EDGE Evolution, EV-DO, Flash-OFDM, 1G, 2G, 2.5G, 2.75G, 3G, pre-4G, 4G, 5G, UMTS W-CDMA, and UMTS-TDD; and a mobile network analyzer operable to analyze a performance of a selected wireless network by at least one of the following techniques:

(a) periodically sending a packet through each of the compatible and currently accessible networks, whereby each of the compatible and currently accessible networks is timed for at least one of data packet throughput speed and data packet integrity;

(b) transferring a file from the communication device to a selected destination node and measuring a time required to complete the transfer, wherein a throughput is calculated by dividing a file size by a time to get the throughput;

(c) pinging a selected destination with a plurality of packets; and (d) accessing performance information stored by a discrete network node.

8. A method, comprising:

providing a wireless communication device comprising:

a display to provide graphical information to a user;

a cellular telephony module to access at least one cellular network;

a wireless communication module to access at least one non-cellular network;

an antenna configured to be in wireless communication with a plurality of compatible and currently accessible communication networks, the plurality of compatible and currently accessible communication networks comprising the at least one cellular network and at least one non-cellular network;

a power source and power control module operable to provide power to the device; and a microprocessor executable mobile network selector; and performing at least one of the following sets of steps:

(a) provide, by the display, to a user of the wireless communication device, for an identified compatible and currently accessible communication network, network information comprising one or more of network speed, network reliability, network performance, network bandwidth, network throughput, and data transmission cost and receive, from the user for wireless communications by the wireless communication device, a selected compatible and currently accessible communication network from among the plurality of compatible and currently accessible communication networks;

(b) receive, from the user, a selection of at least one of a preferred network characteristics to be used in selecting, for wireless communications by the wireless communication device, a compatible and currently accessible communication network from among the plurality of compatible and currently accessible communication networks; and (c) provide, by the display, to the user, an indicator of which network characteristic was selected by the user to be used by the mobile network selector in selecting, for wireless communications by the wireless communication device, a compatible and currently accessible communication network from among the plurality of compatible and currently accessible communication networks; and wherein the at least one non-cellular network is defined by one of the following protocols: Wimax, WiFi™, and Bluetooth™, wherein the at least one cellular network is defined by at one of the following radio data communication protocols: HIPERMAN, iBurst, EDGE Evolution, EV-DO, Flash-OFDM, 1G, 2G, 2.5G, 2.75G, 3G, pre-4G, 4G, 5G, UMTS W-CDMA, and UMTS-TDD, and wherein at least step set (a) is performed, wherein the mobile network selector compares network state information for each of the compatible, currently accessible wireless network with at least one data transmission resource requirement for an application, service, transaction, and/or user preference, based on predetermined rules and determines if one or more of the compatible, currently accessible networks can satisfy the at least one data transmission resource requirement, wherein the at least one data transmission resource requirement comprises multiple requirements ranked hierarchically in order of importance, such that, if a highest ranked requirement is satisfied, but a second highest ranked requirement is not satisfied, by a selected compatible and currently accessible network, the selected compatible and currently accessible network is eligible for selection and wherein the at least one data transmission requirement comprises one or more of data transmission speed required for adequate performance, network reliability required for adequate performance, total network resources consumed or to be consumed, network performance, and network data usage cost per unit.

9. The method of claim 8, wherein step set (b) is performed, and wherein the network characteristic is one or more of network speed, network reliability, network performance, network bandwidth, network throughput, and data transmission cost.

10. The method of claim 8, wherein step set (c) is performed and wherein the network characteristic is one or more of network speed, network reliability, network performance, network bandwidth, network throughput, and data transmission cost.

11. A method, comprising:
providing a wireless communication device comprising:
a display to provide graphical information to a user;
a cellular telephony module to access at least one cellular network;
a wireless communication module to access at least one non-cellular network;
an antenna configured to be in wireless communication with a plurality of compatible and currently accessible communication networks, the plurality of compatible and currently accessible communication networks comprising the at least one cellular network and at least one non-cellular network;
a power source and power control module operable to provide power to the device; and
a microprocessor executable mobile network selector; and
performing at least one of the following sets of steps:

(a) provide, by the display, to a user of the wireless communication device, for an identified compatible and currently accessible communication network, network information comprising one or more of network speed, network reliability, network performance, network bandwidth, network throughput, and data transmission cost and receive, from the user for wireless communications by the wireless communication device, a selected compatible and currently accessible communication network from among the plurality of compatible and currently accessible communication networks;

(b) receive, from the user, a selection of at least one of a preferred network characteristics to be used in selecting, for wireless communications by the wireless communication device, a compatible and currently accessible communication network from among the plurality of compatible and currently accessible communication networks; and (c) provide, by the display, to the user, an indicator of which network characteristic was selected by the user to be used by the mobile network selector in selecting, for wireless communications by the wireless communication device, a compatible and currently accessible communication network from among the plurality of compatible and currently accessible communication networks; and wherein the at least one non-cellular network is defined by one of the following protocols: Wimax, WiFi™, and Bluetooth™, wherein the at least one cellular network is defined by at one of the following radio data communication protocols: HIPERMAN, iBurst, EDGE Evolution, EV-DO, Flash-OFDM, 1G, 2G, 2.5G, 2.75G, 3G, pre-4G, 4G, 5G, UMTS W-CDMA, and UMTS-TDD, and wherein the mobile network selector selects a compatible and currently accessible network in response to one or more of a user establishing a network connection and initiating an application or service, a transaction, or network consumptive and wherein the mobile network selector at least one of: determines an expected likelihood of the at least one data transmission requirement being satisfied by a selected compatible and currently accessible network within a selected period of time; outputs a side-by-side comparison of a current and/or expected performance of each of the compatible and currently accessible networks with the at least one data transmission requirement; assigns a compliance or non-compliance score to each of the plurality of compatible and currently accessible networks; determines an expected performance of each of the plurality of compatible and currently accessible networks within the selected period of time; determines a probability of performing and completing a transaction successfully within the selected period of time; determines an expected cost of the performance and/or completion of the transaction within the selected period of time; and determines an expected cost per unit time of the performance and/or completion of the transaction.

12. The method of claim 8, wherein the mobile network selector selects a compatible and currently accessible network during execution of an application, service, or transaction.

13. The method of claim 8, wherein the display provides simultaneously to the user and for an identified network, measured values for a plurality of network speed, network reliability, network performance, network bandwidth, network throughput, and data transmission cost.

14. A method, comprising:
providing a wireless communication device comprising:
a display to provide graphical information to a user;
a cellular telephony module to access at least one cellular network;
a wireless communication module to access at least one non-cellular network;
an antenna configured to be in wireless communication with a plurality of compatible and currently accessible communication networks, the plurality of compatible and currently accessible communication networks comprising the at least one cellular network and at least one non-cellular network;
a power source and power control module operable to provide power to the device; and
a microprocessor executable mobile network selector; and
performing at least one of the following sets of steps:
(a) provide, by the display, to a user of the wireless communication device, for an identified compatible and currently accessible communication network, network information comprising one or more of network speed, network reliability, network performance, network bandwidth, network throughput, and data transmission cost and receive, from the user for wireless communications by the wireless communication device, a selected compatible and currently accessible communication network from among the plurality of compatible and currently accessible communication networks;
(b) receive, from the user, a selection of at least one of a preferred network characteristics to be used in selecting, for wireless communications by the wireless communication device, a compatible and currently accessible communication network from among the plurality of compatible and currently accessible communication networks; and
(c) provide, by the display, to the user, an indicator of which network characteristic was selected by the user to be used by the mobile network selector in selecting, for wireless communications by the wireless communication device, a compatible and currently accessible communication network from among the plurality of compatible and currently accessible communication networks; and
wherein the at least one non-cellular network is defined by one of the following protocols: Wimax, WiFi™, and Bluetooth™, wherein the at least one cellular network is defined by at one of the following radio data communication protocols: HIPERMAN, iBurst, EDGE Evolution, EV-DO, Flash-OFDM, 1G, 2G, 2.5G, 2.75G, 3G, pre-4G, 4G, 5G, UMTS W-CDMA, and UMTS-TDD; and
wherein the wireless network device further comprises a mobile network analyzer to analyze a performance of a selected wireless network by at least one of the following techniques:
(a) periodically sending a packet through each of the compatible and currently accessible networks, whereby each of the compatible and currently accessible networks is timed for at least one of data packet throughput speed and data packet integrity;
(b) transferring a file from the communication device to a selected destination node and measuring a time required to complete the transfer, wherein a throughput is calculated by dividing a file size by a time to get the throughput;
(c) pinging a selected destination with a plurality of packets; and
(d) accessing performance information from stored by a discrete network node.

15. A non-transitory computer readable medium comprising microprocessor executable instructions that, when executed, perform the following operations:
performing at least one of the following sets of operations:
(a) provide, by a display, to a user of a wireless communication device, for an identified compatible and currently accessible communication network, network information comprising one or more of network speed, network reliability, network performance, network bandwidth, network throughput, and data transmission cost and receive, from the user for wireless communications by the wireless communication device, a selected compatible and currently accessible communication network from among a plurality of compatible and currently accessible communication networks;
(b) receive, from the user, a selection of at least one of a preferred network characteristics to be used in selecting, for wireless communications by the wireless communication device, a compatible and currently accessible communication network from among the plurality of compatible and currently accessible communication networks; and
(c) provide, by the display, to the user, an indicator of which network characteristic was selected by the user to be used by the mobile network selector in selecting, for wireless communications by the wireless communication device, a compatible and currently accessible communication network from among the plurality of compatible and currently accessible communication networks;
wherein the wireless communication device comprises the display to provide graphical information to a user; a cellular telephony module to access the at least one cellular network; a wireless communication module to access the at least one non-cellular network; an antenna configured to be in wireless communication with the plurality of compatible and currently accessible communication networks, the plurality of compatible and currently accessible communication networks comprising the at least one cellular network and at least one non-cellular network; a power source and power control module operable to provide power to the device; and the microprocessor executable mobile network selector; and
wherein the at least one non-cellular network is defined by one of the following protocols: Wimax, WiFi™, and Bluetooth™, wherein the at least one cellular network is defined by at one of the following radio data communication protocols: HIPERMAN, iBurst, EDGE Evolution, EV-DO, Flash-OFDM, 1G, 2G, 2.5G, 2.75G, 3G, pre-4G, 4G, 5G, UMTS W-CDMA, and UMTS-TDD; and
wherein at least step set (a) is performed, wherein the mobile network selector compares network state information for each of the compatible, currently accessible wireless network with at least one data transmission resource requirement for an application, service, transaction, and/or user preference, based on predetermined rules and determines if one or more of the compatible, currently accessible networks can satisfy the at least one data transmission resource requirement, wherein the at least one data transmission resource requirement comprises multiple requirements ranked hierarchically in order of importance, such that, if a highest ranked requirement is satisfied, but a second highest ranked requirement is not satisfied, by a selected compatible and currently accessible network, the selected compatible and currently accessible network is eligible for selection and wherein the at least one data transmission requirement comprises one or more of data transmission speed required for adequate performance, network reliability required for adequate performance, total network resources consumed or to be consumed, network performance, and network data usage cost per unit.

16. The medium of claim 15, wherein step set (b) is performed, and wherein the network characteristic is one or more of network speed, network reliability, network performance, network bandwidth, network throughput, and data transmission cost.

17. The medium of claim 15, wherein step set (c) is performed and wherein the network characteristic is one or more of network speed, network reliability, network performance, network bandwidth, network throughput, and data transmission cost.

18. A non-transitory computer readable medium comprising microprocessor executable instructions that, when executed, perform the following operations:
performing at least one of the following sets of operations:
(a) provide, by a display, to a user of a wireless communication device, for an identified compatible and currently accessible communication network, network information comprising one or more of network speed, network reliability, network performance, network bandwidth, network throughput, and data transmission cost and receive, from the user for wireless communications by the wireless communication device, a selected compatible and currently accessible communication network from among a plurality of compatible and currently accessible communication networks;
(b) receive, from the user, a selection of at least one of a preferred network characteristics to be used in selecting, for wireless communications by the wireless communication device, a compatible and currently accessible communication network from among the plurality of compatible and currently accessible communication networks; and
(c) provide, by the display, to the user, an indicator of which network characteristic was selected by the user to be used by the mobile network selector in selecting, for wireless communications by the wireless communication device, a compatible and currently accessible communication network from among the plurality of compatible and currently accessible communication networks; and
wherein the wireless communication device comprises the display to provide graphical information to a user; a cellular telephony module to access the at least one cellular network; a wireless communication module to access the at least one non-cellular network; an antenna configured to be in wireless communication with the plurality of compatible and currently accessible communication networks, the plurality of compatible and currently accessible communication networks comprising the at least one cellular network and at least one non-cellular network; a power source and power control module operable to provide power to the device; and the microprocessor executable mobile network selector; and wherein the at least one non-cellular network is defined by one of the following protocols: Wimax, WiFi™, and Bluetooth™, wherein the at least one cellular network is defined by at one of the following radio data communication protocols: HIPERMAN, iBurst, EDGE Evolution, EV-DO, Flash-OFDM, 1G, 2G, 2.5G, 2.75G, 3G, pre-4G, 4G, 5G, UMTS W-CDMA, and UMTS-TDD; and wherein the mobile network selector selects a compatible and currently accessible network in response to one or more of a user establishing a network connection and initiating an application or service, a transaction, or network consumptive and wherein the mobile network selector at least one of: determines an expected likelihood of the at least one data transmission requirement being satisfied by a selected compatible and currently accessible network within a selected period of time; outputs a side-by-side comparison of a current and/or expected performance of each of the compatible and currently accessible networks with the at least one data transmission requirement; assigns a compliance or non-compliance score to each of the plurality of compatible and currently accessible networks; determines an expected performance of each of the plurality of compatible and currently accessible networks within the selected period of time; determines a probability of performing and completing a transaction successfully within the selected period of time; determines an expected cost of the performance and/or completion of the transaction within the selected period of time; and determines an expected cost per unit time of the performance and/or completion of the transaction.

19. The medium of claim 18, wherein the mobile network selector selects a compatible and currently accessible network during execution of an application, service, or transaction.

20. The medium of claim 18, wherein the display provides simultaneously to the user and for an identified network, measured values for a plurality of network speed, network reliability, network performance, network bandwidth, network throughput, and data transmission cost.

21. A non-transitory computer readable medium comprising microprocessor executable instructions that, when executed, perform the following operations:
performing at least one of the following sets of operations:
(a) provide, by a display, to a user of a wireless communication device, for an identified compatible and currently accessible communication network, network information comprising one or more of network speed, network reliability, network performance, network bandwidth, network throughput, and data transmission cost and receive, from the user for wireless communications by the wireless communication device, a selected compatible and currently accessible communication network from among a plurality of compatible and currently accessible communication networks;
(b) receive, from the user, a selection of at least one of a preferred network characteristics to be used in selecting, for wireless communications by the wireless communication device, a compatible and currently accessible communication network from among the plurality of compatible and currently accessible communication networks; and (c) provide, by the display, to the user, an indicator of which network characteristic was selected by the user to be used by the mobile network selector in selecting, for wireless communications by the wireless communication device, a compatible and currently accessible communication network from among the plurality of compatible and currently accessible communication networks; and wherein the wireless communication device comprises the display to provide graphical information to a user; a cellular telephony module to access the at least one cellular network; a wireless communication module to access the at least one non-cellular network; an antenna configured to be in wireless communication with the plurality of compatible and currently accessible communication networks, the plurality of compatible and currently accessible communication networks comprising the at least one cellular network and at least one non-cellular network; a power source and power control module operable to provide power to the device; and the microprocessor executable mobile network selector; and wherein the at least one non-cellular network is defined by one of the following protocols: Wimax, WiFi™, and Bluetooth™, wherein the at least one cellular network is defined by at one of the following radio data communication protocols: HIPERMAN, iBurst, EDGE Evolution, EV-DO, Flash-OFDM, 1G, 2G, 2.5G, 2.75G, 3G, pre-4G, 4G, 5G, UMTS W-CDMA, and UMTS-TDD; and wherein the wireless network device further comprises a mobile network analyzer to analyze a performance of a selected wireless network by at least one of the following techniques:

(a) periodically sending a packet through each of the compatible and currently accessible networks, whereby each of the compatible and currently accessible networks is timed for at least one of data packet throughput speed and data packet integrity;
(b) transferring a file from the communication device to a selected destination node and measuring a time required to complete the transfer, wherein a throughput is calculated by dividing a file size by a time to get the throughput;
(c) pinging a selected destination with a plurality of packets; and
(d) accessing performance information from stored by a discrete network node.

* * * * *